United States Patent [19]
Krivokapic et al.

[11] Patent Number: 5,655,110
[45] Date of Patent: Aug. 5, 1997

[54] METHOD FOR SETTING AND ADJUSTING PROCESS PARAMETERS TO MAINTAIN ACCEPTABLE CRITICAL DIMENSIONS ACROSS EACH DIE OF MASS-PRODUCED SEMICONDUCTOR WAFERS

[75] Inventors: Zoran Krivokapic, Santa Clara; William D. Heavlin, San Francisco; David F. Kyser, San Jose, all of Calif.

[73] Assignee: Advanced Micro Devices, Inc., Sunnyvale, Calif.

[21] Appl. No.: 456,938

[22] Filed: May 31, 1995

Related U.S. Application Data

[62] Division of Ser. No. 388,016, Feb. 13, 1995.
[51] Int. Cl.[6] .................................................. G05B 13/04
[52] U.S. Cl. ................... 395/500; 364/468.01; 364/578; 364/490
[58] Field of Search ...................... 364/151, 153, 364/156, 158, 468, 488, 489, 490, 551.01, 578; 395/500

[56] References Cited

U.S. PATENT DOCUMENTS

| | | | |
|---|---|---|---|
| 4,901,242 | 2/1990 | Kotan | 364/468 |
| 5,111,404 | 5/1992 | Kotani | 364/468 |
| 5,260,865 | 11/1993 | Beauford et al. | 364/501 |
| 5,301,118 | 4/1994 | Heck et al. | 364/578 |
| 5,319,564 | 6/1994 | Smayling et al. | 364/468 |
| 5,341,302 | 8/1994 | Connors et al. | 364/578 |
| 5,402,367 | 3/1995 | Sullivan et al. | 364/578 |
| 5,438,527 | 8/1995 | Feldbaumer et al. | 364/578 |
| 5,495,417 | 2/1996 | Fuduka et al. | 364/578 |

OTHER PUBLICATIONS

Dance et al., "Appl. of yield models for semiconductor yield improvement", Defect & Fault Tolerance on VLSI Systems, 1992 pp. 257–266.

Boning et al., "DOE/Opt: A Sys for Design of Experiments, Response Surface Modeling, & Optimization Using Process & Device Simulation", IEEE Trans on Semiconductor Mfg, vol. 7, Iss. 2, May 1994, pp. 233–244.

Iravani et al., "Statistical Modeling Tools, Methods & Applications for IC Mfg", Pra IEEE '95 Conf on Microelectronic Test Structures, vol. 8, Mar. 1995, pp. 203–207.

Williams et al., "Application of Process Statistics to Macro/Behavioral Modeling" IEEE 1993, pp. 515–518.

Pinto et al., "VLSI Tech Dev by Predictive Simulation", 1933 IEEE, pp. 29.1.1–29.1.4.

Duvall, "Towards a Practical Methodology for the Statistical Design of Complex IC Products", 1993 VLSI TSA, pp. 112–116.

Boskin et al., "A Method for Modeling the Manufacturability of IC Design", Proc IEEE Inf Conf on Microelectronics Test Structures, vol. 6, Mar. 1993, pp. 241–246.

Kizilyalli et al., "Predictive Worst Case Statistical Modeling of 0.8 μm Bicmos Bipolar Transistors: A Methodology Based on Process & Mixed Device/Circuit Level Simulators", IEEE Trans. on Electron Devices, vol. 40, No. 5, May 1993, pp. 966–973.

Welten et al., "Statistical Worst–Case Simulation for CMOS Technology", IEE Collog. No. 153: Improving the Efficiency of IC Mfg. Technology, 1995.

(List continued on next page.)

Primary Examiner—Kevin J. Teska
Assistant Examiner—Tyrone V. Walker
Attorney, Agent, or Firm—Fliesler, Dubb, Meyer & Lovejoy

[57] ABSTRACT

A method and system are disclosed for: (a) matching a machine-implemented process simulator with an actual fabrication line, (b) using the matched model to simulate the statistical results of mass production by the modeled production line, (c) using the model to predict cross-reticle variance from collected data for in-scribe features, (d) using the model to decompose the variance contributions of each process parameter and identify the more prominent contributors, and (e) using the model to identify the process parameter adjustments which would provide best leverage when taken one at a time.

39 Claims, 10 Drawing Sheets

OTHER PUBLICATIONS

Niu et al., "A Bayesiar Approach to Variable Screening for Modeling the IC Fabrication Process", Circuits & Systems, 1995 IEEE Int'l Symposium, pp. 1227–1230.

Lopez–Serrano et al., "Yield Enhancement Prediction w/Statistical Process Simulations in an Advanced Poly--emitter Complementary Bipolar Technology", IEEE 1994 Custom IC Conf. pp. 13.1.1(289)–13.1.4(292).

Reitman et al., "Process Models & Network Complexity", 1993 Int'l Conf on Neural Networks, pp. 1265–1269.

Smith et al., "Comparison of Scalar & Vector diffraction Moedlling for deep–UV lithography", SPIE vol. 1927 Optical/Laser Microlithography VI–1993, pp. 847–857.

Dill et al., "Modelling Positive Photoresist", Proceedings of the Kodak Microelectronics Seminar, Oct. 1974, pp. 24–31.

Owen, "Controlling Correlations in Latin Hypercube Samples", 1994 Jour. Amer. Statistical Assoc., vol. 89 No. 428, Dec. 1994, pp. 1517–1522.

Heavlin, "Variance Components & Computer Experiments", Proc 1994 Amer. Statistical Assoc., pp. 103–108.

Mack, "Development of Positive Photoresists", Jour. Electrochem. Soc: Solid State Sci. & Tech., vol. 134 Issue 1, Jan. 1987, pp. 148–152.

Stein, "Large Sample Properties of Simulations Using Latis Hypercube Sampling", Technometrics, vol. 29 Iss. 2, May 1987, pp. 143–151.

Neureather et al., "Photoresist Modeling & Device Fabrication Appl.", Optical & Acoustical Microelectronics, 1974, pp. 223–247.

Mandel, *The Statistical Analysis of Experimental Date*, John Wiley & Sons, 1964, Chap. 12, pp. 272–310.

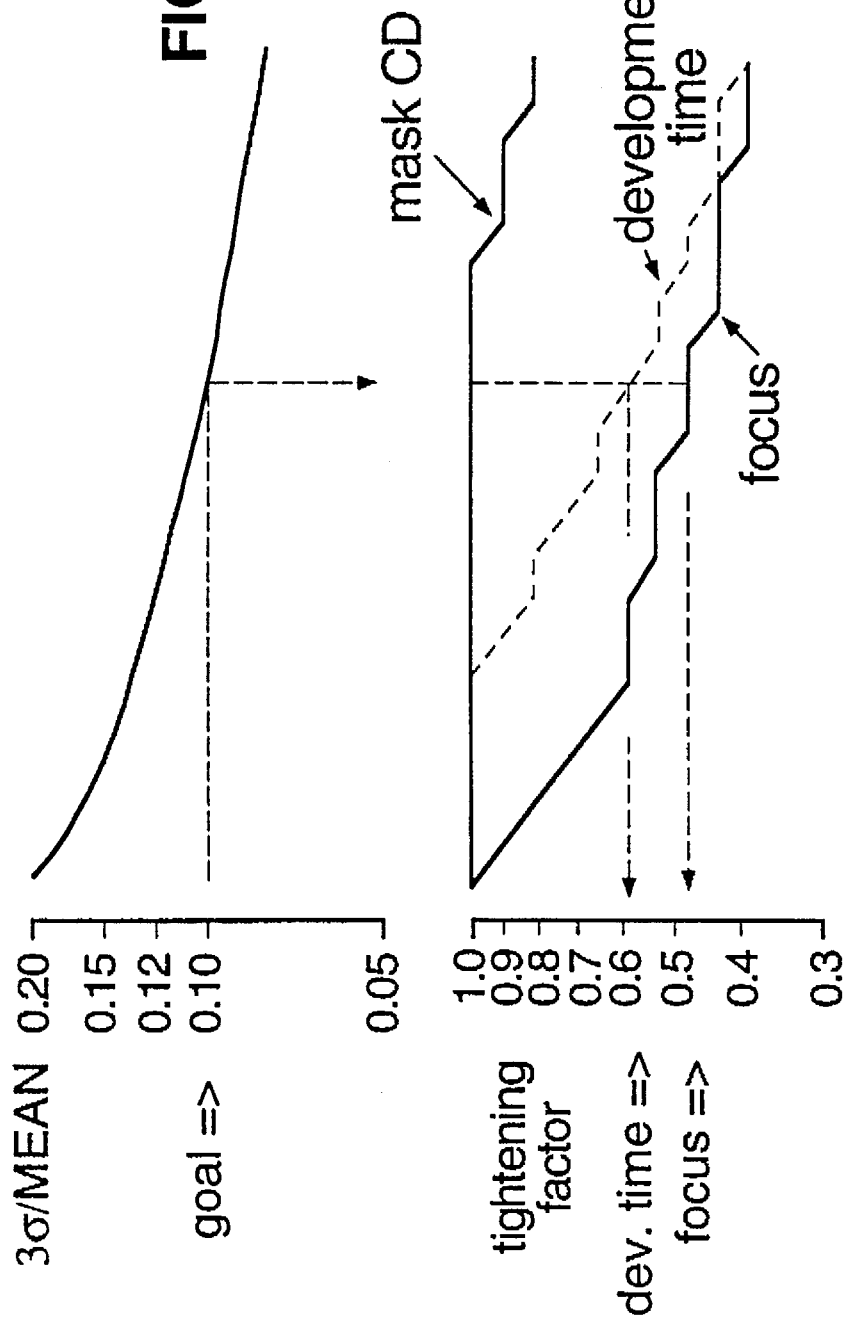

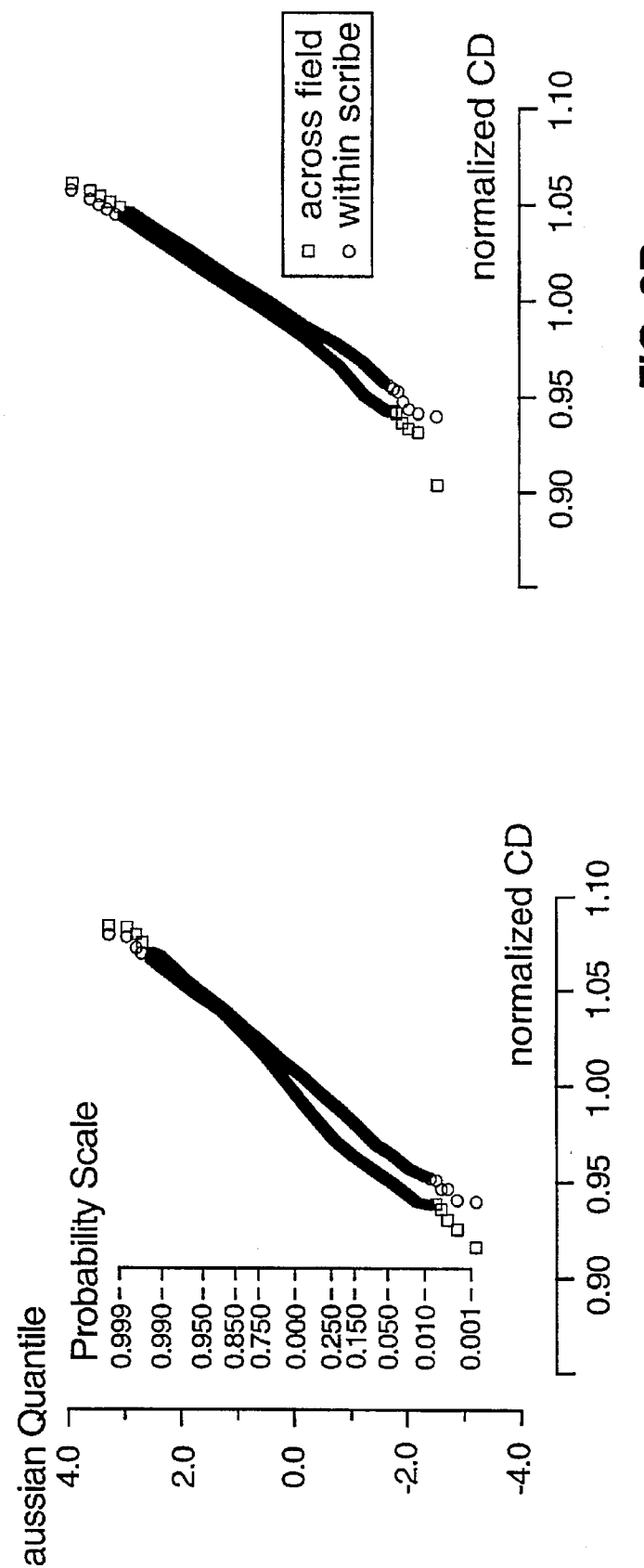

METHOD FOR SETTING AND ADJUSTING PROCESS PARAMETERS TO MAINTAIN ACCEPTABLE CRITICAL DIMENSIONS ACROSS EACH DIE OF MASS-PRODUCED SEMICONDUCTOR WAFERS

This application is a division of Ser. No. 08/388,016, filed Feb. 13, 1995.

BACKGROUND

1. Field of the Invention

The invention is directed to the mass production of semiconductor devices. The invention is more particularly directed to the problem of perceiving interactions between interrelated process steps on a mass-production line and maintaining acceptable critical dimensions across each die of a plurality of mass-produced integrated circuit wafers.

2. Cross Reference to Related Publications

The following publications are cited here for purposes of reference:

(1) S. Kaplan and L. Karklin, "Calibration of Lithography Simulator by Using Substitute Patterns," *Proceedings on Optical/Laser Microlithography VI*, SPIE 1927, pp847–858, 1993.

(2) C. Mack and E. Charrier, "Yield Modeling for Photolithography," *Proceedings of OCG Microlithography Seminar*, pp171–182, 1994.

(3) *TMA DEPICT, Two-Dimensional Process Simulation Program for Deposition, Etching, and Photolithography*, version 3.0, Technology Modeling Associates, Inc., Palo Alto, Calif., 1993.

(4) Mandel, J, *The Statistical Analysis of Experimental Data*, chapter 12. Wiley, New York, 1964

(5) Z. Krivokapic and W. D. Heavlin, "Predicting Manufacturing Variabilities for Deep micron Technologies: Integration of Process, Device, and Statistical Simulations," in *Simulation of Semiconductor Devices and Processes*, 5, S. Selberherr, H. Stippel and E. Strasser, eds, pp229–232, Springer-Verlag, New York, 1993.

(6) W. D. Heavlin and G. P. Finnegan, "Dual Space Algorithms for Designing Space-filling Experiments," *Interface 1994*, Research Triangle, N.C., June 1994.

(7) B. D. Ripley, *Spatial Statistics*, pp44–75, Wiley, New York, 1981.

(8) A. B. Owen, "Controlling Correlations in Latin Hypercube Samples," *Journal of the American Statistical Association*, vol 89, no. 428, pp1517–1522, December 1994.

(9) W. D. Heavlin, "Variance Components and Computer Experiments," 1994 *ASA Proceedings, section on Physical and Engineering Sciences*, Toronto, August 1994.

(10) A. R. Neureuther and F. H. Dill, "Photoresist Modeling and Device Fabrication Applications," *Optical and Acoustical Microelectronics*, pp223–247, Polytechnic Press, New York, 1974.

(11) F. H. Dill, J. A. Tuttle, A. R. Neureuther, "Modeling Positive Photoresist," *Proceedings, Kodak Microelectronics Seminar*, pp24–31, 1974.

(12) C. Mac, "Development of Positive Photoresists," *Journal of the Electrochemical Society*, vol 134, January 1987.

(13) M. Stein, "Large Sample Properties of Simulations using Latin Hypercube Sampling," *Technometrics*, vol 29, no 2, pp143–151, May 1987.

(14) M. D. McKay and R. J. Beckman, "Using Variance to Identify Important Inputs," 1994 *ASA Proceedings, Section on Physical and Engineering Sciences*, Toronto, August 1994.

3. Description of the Related Art

Modern, high-density, integrated circuit devices are typically mass-produced with large numbers of critically-dimensioned features.

Examples of critically-dimensioned (CD) features include transistor channel length (gate length), transistor channel width, trench depth, step slope, and so forth.

The channel length, of each insulated gate field effect transistor (IGFET) within an integrated circuit is critical for example, because the length determines a variety of local and global characteristics such as maximum transistor switching speed, overall device operating speed, overall power consumption, breakdown voltage, and so forth. The combination of gate length and channel width defines the area consumed by each transistor. The pitch and other dimensional values of repeated structures establish the maximum packing density for multiple circuits within an integrated circuit (IC) die having given maximum dimensions.

It is desirable to maintain the respective critical dimensions of each die within a plurality of mass-produced IC wafers constrained to certain respective value ranges (or 'guard bands') in order to assure desired operating speeds and other dimension-dependent characteristics.

Ideally, every device produced by a given mass production line should have the same critical dimensions for each of its transistors and/or each of its other basic electronic components (e.g., resistors, capacitors, interconnect lines).

The reality, however, is that the critical dimensions of mass-produced devices are subject to small, but nonetheless significant, random variations.

Random variations tend to occur between the critical dimensions of one mass-produced wafer and the next. Random variations tend to occur between the critical dimensions of one IC chip and the next as one sweeps across a given wafer. Random variations tend to occur even between the critical dimensions of one transistor and the next as one sweeps across a given integrated circuit (IC) chip or 'die' of a mass-produced wafer. The variations across a given die are sometimes referred to as cross-reticle deviation.

Each feature on each IC die in a mass-produced wafer is the product of a succession of many process steps. Each process step is controlled by a combination of variable process parameters.

Different combinations of variations in process parameter can occur on a random basis across the plural process steps of a mass-production line, on a die-by-die basis. This introduces 'noise' into the uniformity of the product outflow of the mass-production line. Sometimes a specific permutated-combination of process parameter deviations is relatively innocuous, sometimes it is not. It all depends on which process parameters are deviated for a given IC die and how their respective process steps interrelate to establish critical dimensions on that given die.

By way of example, consider the multiple, interrelated process steps that are typically employed to define a pattern of conductive lines disposed across an insulator of an IC chip.

First, a dielectric layer of a generally non-planar form is created across the wafer. Such a non-planar dielectric layer may constitute the combined gate oxide and field oxide of a CMOS device. The non-planarity of the dielectric layer may alternatively be attributed to the non-planarity of underlying trenches, steps, mesas or other topographic features of the chip.

Next, a polysilicon or other conductive layer is deposited conformably on top of the dielectric layer. An anti-reflective coating (ARC) may be optionally deposited on the conductive layer to reduce undesired reflections in a following exposure step.

The deposition of the conductive layer and optional ARC layer is followed by a spinning-on or other deposition of a photoresist (PR) layer. The PR layer may or may not be planarized depending on process specifics.

The photoresist-coated wafer is then positioned within a stepper by an alignment mechanism. Tiled areas of the photoresist (PR) are successively exposed to a stepped pattern of resist-modifying radiation. After the step-wise exposure, the photoresist is "developed" by, for example, soft baking the wafer to induce cross-polymerization in the photoresist material and by subsequently dissolving away non-hardened portions of the photoresist with a specific solvent. The developed photoresist defines an etch mask.

The developed wafer is next etched, for example in a plasma etch chamber, so as to transfer the hardened image in the photoresist to the conductive layer. This produces a corresponding pattern of lines in the conductive (e.g., doped polysilicon) layer.

The photoresist mask is stripped off, or kept depending on process specifics, and further process steps follow. One example of a further process step is the selective implant of dopants into exposed semiconductor regions so as to create self-aligned source and drain regions at opposed sides of each conductive line, where the conductive line lies over gate oxide. The width of the conductive line at such a region of dopant implant defines the channel length of the formed IGFET transistor.

Within each of the above-described process steps, there are one or more variable physical attributes (or 'process parameters') that control the final outcome. Some process parameters may be adjusted by a line operator. Some are 'set' by the design of the process equipment that is installed into the mass-production line.

Irrespective of how and when an attempt is made to 'set' each process parameter to a particular goal value (either while the mass-production line is up and running, or when new production equipment is introduced into the mass-production line), the 'setting' does not always define precisely what the actual value of the process parameter will be during any given instant of line operation for a given IC die. There is slack in virtually every setting. The actual value of each 'pre-set' process parameter can drift or otherwise move away from its goal value due to a variety of mechanisms occurring at different times along the mass-production line.

The over-time variations of process parameters introduce 'noise' into the critical dimensions of features (e.g., conductor linewidths, channel length) that define the operating characteristics of the end products flowing off the fabrication line.

An example of noise introduction may be seen by considering the respective thicknesses of the above-mentioned ARC (anti-reflective coating) layer and PR (photoresist) layer. The thicknesses of each may be 'set' to respective goal value at the start of a process run. The actual thickness values for the ARC and PR layers may change across a production run, however, due to slight variations in material viscosity, due to different coating adhesion attributes present at the center and edge portions of each wafer, and for a variety of other reasons.

During the radiation exposure step, as one samples individual IC chips of each successive wafer, the position of the radiation pattern focal points may change relative to the photoresist layer. The amount and phase of undesired reflection may change. Such variations may be due to the previously-introduced variations in the respective thicknesses of the ARC and PR layers.

The position and intensity of the radiation pattern relative to the photoresist layer may also change as a consequence of further variance in the exposure optics (e.g., focus drift). Exposure time and dosage may vary from pre-set goal levels on a die-by-die basis. The critical dimensions of radiation-modifying features within the exposure mask may also vary on a die-to-die basis as a result of thermally-driven expansion and contraction.

Consequently, no two randomly-sampled dice on a given wafer are guaranteed to have exactly the same radiation exposure conditions.

Post-exposure development time and temperature are also subject to variance away from pre-established goal values. The diffusion length of the development chemistry may vary across a wafer. In a subsequent plasma etch, the variables can include: time, pressure, temperature, flow rate, and field-proximity effects resulting from the pitch and step profile of closely spaced mask features.

Because successive steps of IC production tend to be interdependent, a slight variation in parameter(s) of one process step can be magnified by a further variation in the parameters of a second process step to produce unacceptable numbers of defective product at the output end of the mass-production line.

For example, if PR (photoresist) thicknesses decreases slightly and the focal depth of the exposure optics also decreases slightly and the exposure dosage also decreases slightly during production of a first-sampled IC chip as compared to the corresponding process parameters for a second-sampled IC chip, the combined effect may be to significantly shift the position and intensity of the radiation exposure pattern relative to the photoresist layer during the production of the first-sampled IC chip. The second-sampled IC chip may come off the production line in acceptable form while the first-sampled chip comes out of the same mass-production line in defective form.

It is hard to pinpoint why mass-production yield for a given circuit layout on a given mass-production line becomes unacceptably low. The statistical variance of PR thickness across the production lot may be small. The statistical variance of focus across the production lot may be small. But the physical interaction between the two noise quantities can be such that the over all lithography process produces chips having a much larger variance in terms of critical dimensions. If the overall variance in final critical dimensions becomes too large, production yield may suffer significantly.

The statistics-wise interdependence of specific process steps is not easily perceived. It is not consistent across all steps, or even as between different product designs. By way of example, compare the layout of a densely packed memory circuit against the less regular layout of a random logic circuit. Some circuit layouts give rise to more so-called 'field proximity effects' than others. (Field proximity effects occur in process steps such as exposure and plasma etch.) These field proximity effects can affect mass-production yield, as can many other factors.

In short, a fairly complex matrix of relationships exists between material deposition operations, mechanical operations, optical operations, thermal operations, chemical reactions and the specific layout of each product. It can turn out for each given layout that relatively small variances in certain, key process parameters have far more dominant effects on critical dimensions of the final product than do larger variances in other process parameters.

Heretofore, there was no easy way to perceive for each given circuit layout and the specific process steps that are used to mass-produce that circuit, what contribution the individual variance of each process step made to overall process variance.

Heretofore, when critical dimensions in the outflow of a mass-production line were observed to have slipped out of acceptable range, or were observed to be slipping towards such an undesirable condition, there was no well-defined systematic methodology for determining which process parameters did or did not need adjustment so as to rectify the situation.

If the linewidths in the gate polysilicon layer of mass-produced dice are observed to be coming out too large or too small, should the exposure dosage be adjusted? And if so, in which direction and by how much? Should the line operator play around with the stepper focus first or would it be better to first alter the development time?

Each such situation was dealt with in the past on the basis of gut intuition and trial-and-error guess work. There were simply too many combinations and permutations of process variables to play with.

Production line designers and workers were left to sheer speculation on the root cause when something went wrong in the final output of the mass-production line. Do any of the process variables need to be tweaked? And if so, which process parameter should be adjusted and which should be left alone? Of those that need tweaking, what is the best incremental value for each tweak, and in which direction should it go? If multiple process parameters are to be adjusted, which should be tweaked first?

The problem of figuring out which process parameters need to be tweaked first and by how much, is not limited to pre-established fabrication lines.

It also ripples into the construction plans of next-generation fabrication plants. If one wishes to scale down a given circuit layout from say 0.50 micron linewidths to say, 0.35 micron linewidths, or to 0.20µ linewidths, which process parameters are going to require the tightest tolerances? Should the thermal expansion specifications for the exposure mask be tighter than before, or does the key bottleneck to acceptable yields from next-generation fabrication lie in the precision of the optics focus, or in the variance of the development chemistry?

Ideally, one could try to obtain tighter tolerances in all the process steps of the production line. Unfortunately, in the real world, there are finite costs associated with tightening the tolerances of each process step. There are limited budgets in terms of time and resources. Choices have to be made as to which process parameters in a next-generation production line need maximum effort and which do not.

Heretofore, such choices for next-generation plant design and construction were made on a speculative basis. This sometimes led to great waste of time and resources.

Accordingly, there is need within the industry for a more disciplined methodology of quickly and automatically identifying the specific process steps whose noise-induced variations contribute most to problems in the mass-production outflow. There is need within the industry for an automated system of adjusting those process parameters in amass-production line whose adjustment will be most beneficial while leaving alone those whose adjustment will be detrimental.

SUMMARY OF THE INVENTION

It is an object of the invention to provide a systematic methodology for identifying process parameters whose variances dominate in the outflow of a given circuit design from a given mass-production line and to adjust the mass-production line process parameters or variances accordingly.

A method in accordance with the invention comprises the steps of:

(a) taking sample measurements of critical dimensions for a given test feature (e.g., in-scribe first-poly linewidths) within the outflow of a mass production line;

(b) developing a statistical profile of the sampled measurements;

(c) extrapolating from the sample profile a broader statistical profile that applies to other features (e.g., within-die poly linewidths) of the production line outflow;

(d) comparing the extrapolated statistical profile against a predefined acceptable profile; and (e) consulting a computer-implemented process model to select and adjust those process steps that will most quickly bring the extrapolated profile into agreement with the acceptable profile.

A system in accordance with the invention comprises: (a) a mass-production line that processes wafers having a given circuit layout on a mass-production basis; (b) sample-and-measure means for sampling processed wafers flowing through the mass-production line and measuring and storing the values of critical dimensions of the sampled wafers; (c) a machine-implemented, matched process model that is calibrated by use of the stored values of critical dimensions of the sampled wafers to model the behavior of the mass-production line with respect to the given circuit layout; (d) consultor means for consulting the matched process model to predict the statistical behavior of the mass-production line for large numbers of wafers for various settings of process parameters and various tolerance allowances in those process parameters; and (e) expert control means, operatively coupled to the sample-and-measure means, to the consultor means, and to the mass-production line, for detecting undesired variances in the statistical distribution of the processed wafer outflow of the mass-production line, for querying the consultor means to identify the most likely contributing causes for said undesired variances, and for responsively adjusting the settings of process parameters and/or the tolerance allowances of those process parameters that are identified as being the most likely contributing causes for said undesired variances.

BRIEF DESCRIPTION OF THE DRAWINGS

The below detailed description makes reference to the accompanying drawings, in which:

FIGS. 8A and 8B are aligned plots showing how flip flopped incremental tightening of two select process parameters drives overall process variance to a desired goal; and FIGS. 9A and 9B depict the shift in critical dimension distribution for in-scribe and cross-reticle values with respective circuit layouts having densely packed and relatively isolated interconnect lines.

DETAILED DESCRIPTION

Figure 1:
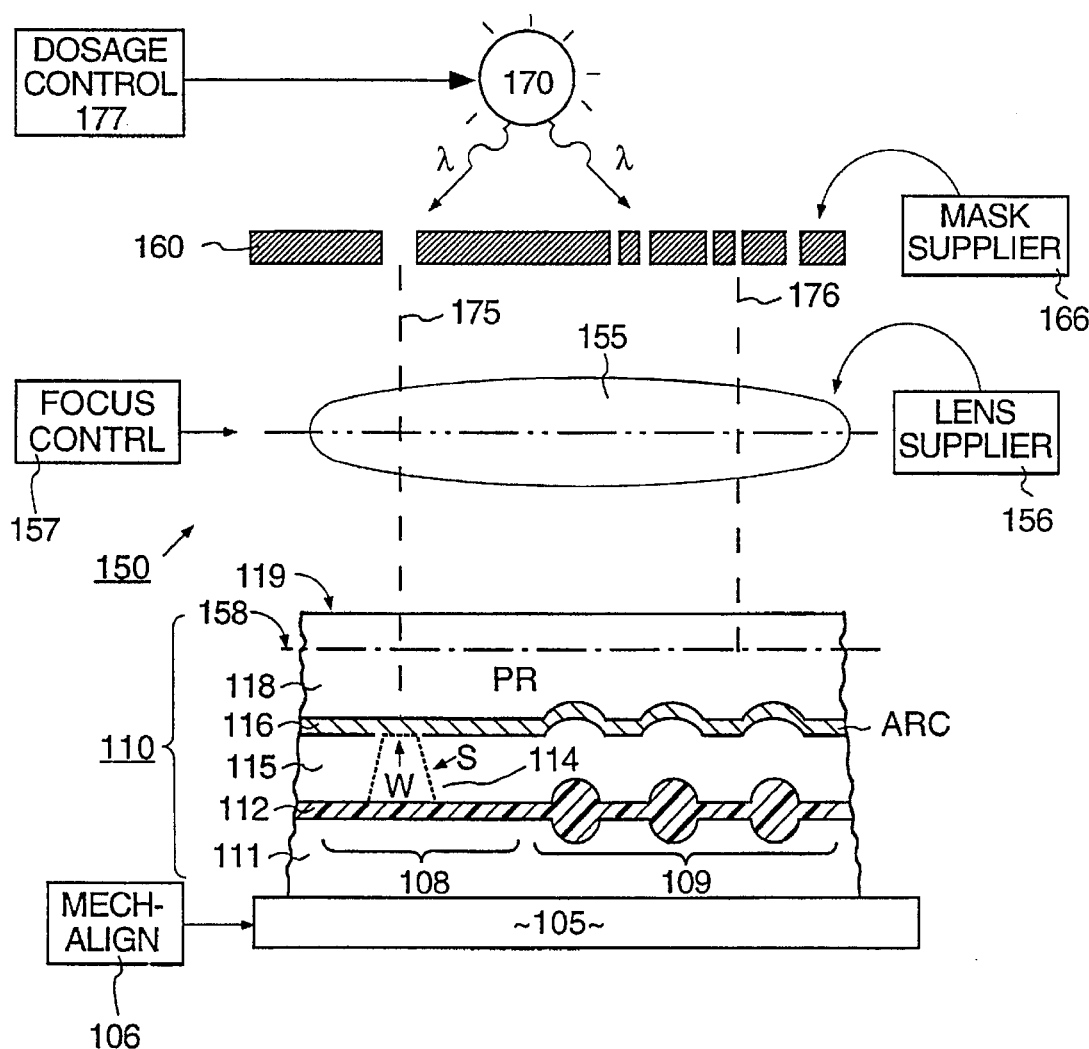
FIG. 1 is a cross-sectional view illustrating reticle-wide exposure conditions within a lithography stepper.

FIG. 1 is a cross-sectional view diagraming cross-reticle conditions within a stepper 100 during photoresist exposure.

A photoresist pre-coated wafer 110 is shown supported on a stepper chuck 105. The chuck 105 is translated by a mechanical alignment means 106 to bring the wafer 110 into alignment with stepper optics 150.

The wafer 110 is subdivided from its top view (see also FIG. 4) into a plurality of exposure tiles or 'reticle areas'. Each reticle area includes an in-scribe area 108 and an in-die area 109. The width of the in-scribe area 108 is exaggerated in FIG. 1 for purpose of illustrative clarity.

As seen in FIG. 1, the wafer 110 comprises a base portion 111 (e.g., composed of for example pre-doped bulk monocrystalline silicon), a dielectric layer 112 (e.g., gate and field oxide), a to-be-patterned conductive layer 115 (e.g., polysilicon layer), an anti-reflective coating (ARC) layer 116 and a photoresist (PR) layer 118 having a planarized top surface 119.

A stepper radiation source 170, such as an i-line 365 nm mercury-arc lamp, supplies exposure radiation 175, 176 to the wafer through a pre-patterned mask 160 and optics section 150 for a given amount of time in order to create a radiation exposure pattern within the underlying photoresist layer 118. The mask 160 is supplied by a prescribed mask manufacturer 166. The mask manufacturer 166 defines the thermal expansion and other vital characteristics (e.g., critical dimensions) of the mask 160. These characteristics can be adjusted by ordering a new mask 160 from mask manufacturer 166 and installing it in the stepper 100.

The optics section 150 includes a lens 155 having a predefined curvature and parasitic optical aberrations. The lens 155 is supplied by a prescribed lens manufacturer 156. The lens manufacturer 156 defines the curvature and other characteristics (e.g., precision) of the lens 155. These characteristics can be adjusted by ordering a new optics section from the manufacturer and installing it in the stepper 100.

A focus control 157 is coupled to the stepper optics 150 for moving the focal plane 158 (or locus of focal points 158) of the stepper optics 150 relative to the photoresist layer 118. Focus is defined here as the distance of the focal plane 158 relative to the top surface 119 of the photoresist layer. A negative focus value indicates that the focal plane 158 is below top surface 119 and within the photoresist layer 118. A positive focus value indicates that the focal plane 158 lies above the photoresist top surface 118.

The mask 160 includes a plurality of apertures or other light-modifying features (e.g., phase-shifting features) for creating a desired pattern of exposure radiation within photoresist layer 118. The mask 160 may have a number of critical parameters such as a mean critical dimension for its smallest apertures and a statistical deviation relative to this mean. The mask may also have a predefined coefficient of thermal expansion. The mask 160 typically includes chromium as its active radiation-blocking layer. As indicated above, the critical parameters of the mask are controlled by a prescribed mask manufacturer 166 from which the mask is obtained.

The intensity and duration of radiation provided by the stepper radiation source 170 is controlled by a dosage control unit 177. The intensity of the radiation supplied to the focal plane 158 by way of optics 150 to the plane in which the photoresist layer 118 normally resides may be measured using a dosimeter as is well known in the art. The dosage control unit 177 may be adjusted ('set') to supply, within tolerances, a desired dosage level from the radiation source (mercury arc lamp) 170 to the focal plane 158.

The trapezoidally shape dashed region 114 depicts the profile within conductive layer 115 of a conductive line that is to-be ultimately defined from the material of the conductive layer 115. The to-be-produced conductive line 114 has a certain width W, a certain profile slope S and a certain thickness T. (See also FIG. 5.)

As those skilled in the art will appreciate, the width W, slope S, and thickness T of the to-be-produced conductive line 114 depend on many variable factors, including but not limited to: the refractive index and thickness of the ARC layer 116; the opto-chemical reactivity and thickness of the photoresist layer 118; the position of the focal plane 158 relative to the PR layer 118; the variability of critical dimensions within the mask 160; and the intensity and duration of the supplied exposure radiation 175, 176 across the reticle area.

The to-be-produced conductive line 114 is shown positioned within the die's in-scribe area 108. It is to be understood that many other conductive lines (not shown, see FIG. 4 instead) are to be simultaneously produced in the in-die area 109. The profiles of these other lines are not shown within FIG. 1 in order to avoid illustrative clutter.

The other to-be-produced conductive lines (not shown in FIG. 1) of the in-die area 109 develop under slightly different conditions from those of the to-be-produced conductive line 114 in the in-scribe area 108. First, they are generally packed closer to one another. This introduces so-called optical proximity effects during exposure and so-called field proximity effects during subsequent plasma etch. Second, the to-be-produced conductive lines (not shown) of the in-die area 109 receive their exposure radiation 176 from different parts of the lens 155 and different parts of the mask 160. Third, the to-be-produced conductive lines (not shown) of the in-die area 109 are often situated in a generally non-planar portion of the conductive layer 115 (e.g., near the field oxide). The in-scribe area 108 in contrast is relatively planar.

Despite these differences, the to-be-produced, isolated conductive line 114 of the in-scribe area 108 is often taken as being representative of the other, densely-packed lines (not shown) in the in-die area 109. The critical dimensions of the isolated conductive line 114 (or of the corresponding aperture, not shown, in the photoresist layer 118) are measured prior to wafer scribing to get a sense of how well the densely-packed lines (not shown) of the in-die area 109 developed as a result of lithography. The scribing step cuts the wafer into individual dice and usually destroys the isolated conductive line 114 at the same time.

Ideally, a better measure could be obtained of the in-die critical dimensions by actually sampling linewidths within the in-die area 109. However, it is not practical in a mass-production environment to measure each of the numerous (typically millions of) lines of the in-die area 109. The isolated conductive line 114 serves as an easily identifiable proxy.

Figure 2:
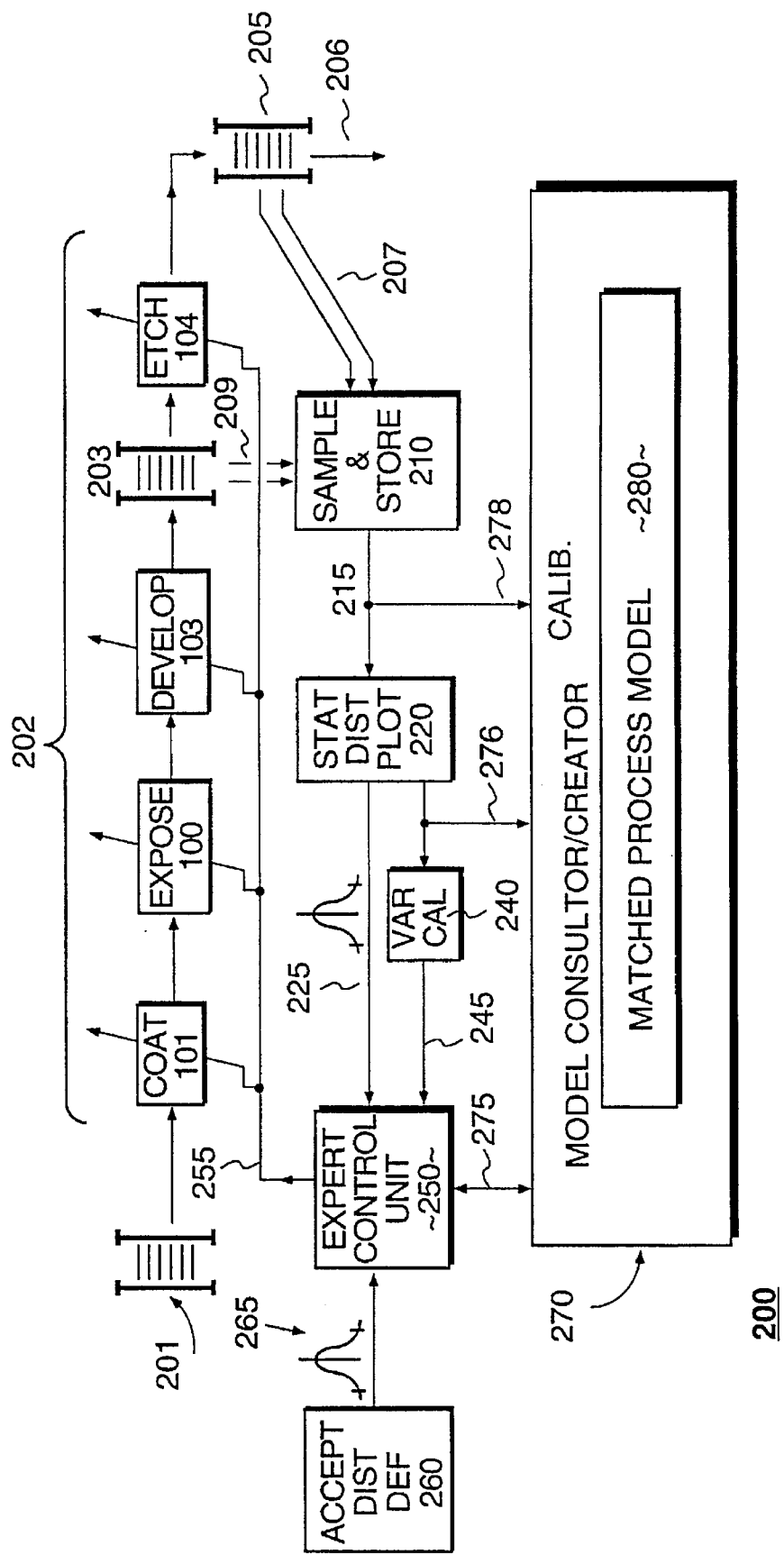
FIG. 2 is a block diagram of a wafer fabrication system in accordance with the invention.

Referring to FIG. 2, the exposure step 100 is but one of plural process steps through which the mass-processed wafers move. As seen in FIG. 2, an input lot 201 of wafers is supplied to mass-processing line 202. The number of wafers in a lot 201 can vary but is typically on the order of 20–25 wafers per lot (the number of wafers held by a wafer transport cassette). The circuit layouts for the production dice on each wafer of a given lot are typically all the same.

The wafers of each lot 201 are moved through the process line 202 one after the next. After one lot 201 is input, a next lot having the same circuit design (not shown) is input, and another, and so forth. Typically, a large number of lots will be processed at one time for each type of to-be-produced circuit (e.g., a memory device or a microprocessor or a programmable logic device).

The mask 160 and other process parameters are usually changed when switching from one type of to-be-produced circuit to another.

The mass-processing line 202 is part of an overall wafer processing system referred to herein as 200. Processing line 202 includes: (1) a first station 101 for coating each wafer with material layers such as the earlier mentioned ARC and PR layers (116, 118); (2) a second station 100 such as previously described for exposing the material layers (the photoresist layer) to a radiation pattern; (3) a third station 103 for developing each exposed wafer; and (4) a fourth station 104 for etching each developed wafer.

Figure 4:
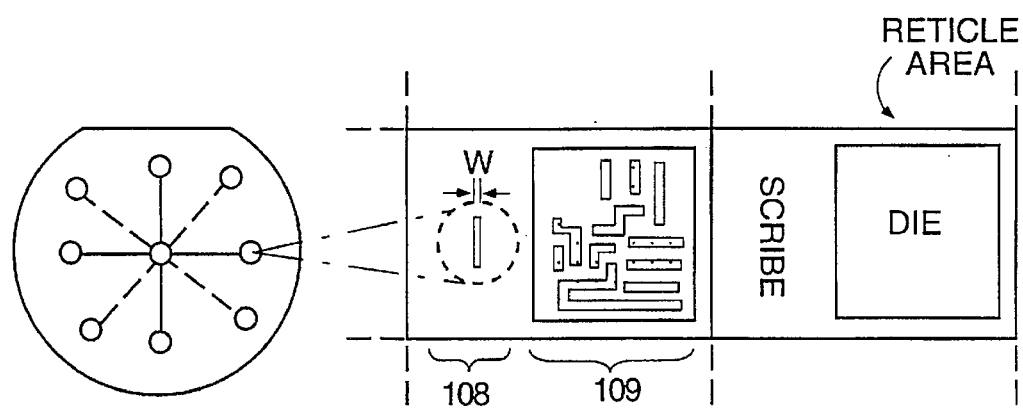
FIG. 4 diagrams the in-scribe and in-die areas of a sampled wafer.

The output of development station 103 is shown as developed wafer lot 203. The output of processing line 202 is shown as post-etch wafer lot 205. Typically, each post-etch wafer lot 205 is moved further downstream for further processing (e.g., dopant implant) as indicated by flow line 206. Before such further processing 206, however, two or more sample wafers from each post-etch wafer lot 205 are temporarily removed as indicated by dual lines 207 and the critical dimensions of in-scribe lines that are formed at standard measurement positions (e.g., 5-point or 9-point as shown in FIG. 4) are measured and stored by sampler unit 210. A similar sample, measure and store procedure may be carried out for critical photoresist dimensions of each developed wafer lot 203 as indicated by dual lines 209.

After a large number of processed lots 203, 205 belonging to a given circuit design have passed by sampler unit 210, a statistical distribution profile 225 of the in-scribe sampled values is developed by a statistical analyzing and profiling unit 220.

The profiler unit 220 can be implemented as an independent computer unit or can be a module within a computer that also carries out functions of other described or to-be described modules. The statistical distribution profile 225 output by profiler 220 typically defines a smooth curve that is interpolated from the discrete data points defined by the sample data stored in the sample-and-store unit 210 for a given processing run. This statistical distribution profile 225 is submitted to a computer-implemented expert control unit 250 for analysis and responsive action.

The statistical distribution profile 225 can be analyzed to determine its corresponding points of standard deviation or variance. A variance calculating unit 240 is shown in FIG. 2 as producing signals 245 representing this information and submitting it to the expert control unit 250. Alternatively, the expert control unit 250 may contain an equivalent of the variance calculating unit 240 inside.

The expert control unit 250 is coupled by way of control bus 255 to control the process parameters of one or more of the coating station 101, the exposure station 100, the development station 103 and the etch station 104.

Expert controllable parameters of the coating station 101 may include the ARC layer thickness, the ARC refractive index (by choice of material) and the photoresist thickness. Controllable parameters of exposure unit 100 may include the mean focus depth, the exposure dosage, the partial coherence of the exposure radiation, the numeric aperture of the stepper optics and the phase shift angles of the mask. Controllable parameters of the developing station 103 may include the development time, development temperature and diffusion length (by choice of the photoresist material and development materials). Controllable parameters of the etch station 104 may include chamber pressure, flow rate, temperature, field intensity, and etch time.

In addition to the in-scribe profile data 225 and the in-scribe variance data 245, the expert control unit 250 receives from supply means 260 another data set 265 representing an acceptable in-die statistical distribution profile and its corresponding variance points. Note that in-scribe data and in-die data are associated with different physical regions of each reticle. The in-scribe data 225, 245 represents the mass-production statistics of in-scribe area 108 in FIGS. 1, 4 while the desired in-die data set 265 represents the mass-production statistics that will be acceptable for the in-die area 109 (or alternatively across the entire reticle).

The expert control unit 250 is configured so as to receive the in-scribe profile data 225, 245; to extrapolate from the received data 225, 245 a prediction of what the in-die profile data most probably looks like for the same wafer lots 203, 205; and to test the extrapolated profile data against the acceptable profile data 265.

The expert control unit 250 is further configured such that, in the case where the extrapolated data is not in agreement with the acceptable data 265, the expert control unit 250 automatically selects one or more of the controllable parameters of processing line 202 and causes those parameters to be adjusted so as to bring the extrapolated in-die profile into agreement with the acceptable in-die profile 265.

The control decisions of the expert control unit 250 are predicated on a computer-implemented modeling system 270 to which the expert control unit 250 is coupled by way of interface 275.

The modeling system 270 is structured to first create a 'matched' process model 280 that predicts the behavior of the actual processing line 202 (based on actually obtained measurements 278) and to secondly consult with the matched process model 280 after it has been created so as to see what happens hypothetically if certain process parameters and/or their respective tolerances are adjusted one way or another.

The interface 275 between the expert control unit 250 and the process modeling system 270 carries both control signals for mediating the model creation operation and also consultation input/output data that lets the expert control unit 250 pose various queries to the process modeling system 270.

Connection 278 is used during the model creation operation to calibrate the output data of the model 280 to actual data held within the sample-and-store unit 210. Connection 276 is used for checking for a match between the output plot 225 of distribution profiler 220 and a to-be-described other statistical distribution plot 325 of a predictive distribution plotter 320 shown in FIG. 3.

The expert control unit 250 may be implemented as a computer including a central processing unit and appropriately programmed memory. The next-described process modeling system 270 may also be implemented as part of the same computer system or may be implemented as separate hardware. The previously described sample-and-store unit 210, distribution profiler 220 and variance calculating unit 240 may be each similarly implemented as separate hardware or incorporated into the computer system that includes the expert control unit 250.

Figure 3:
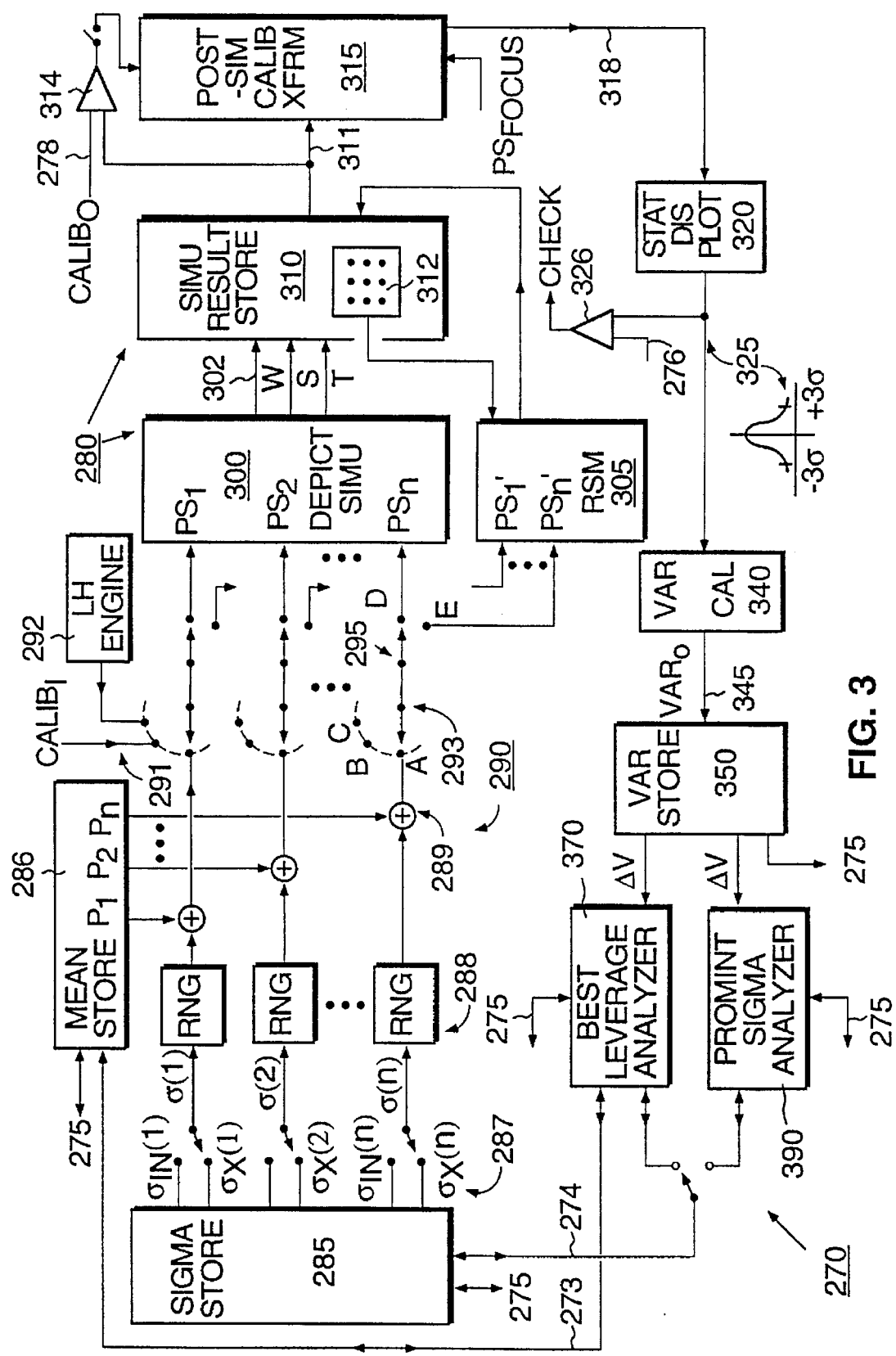
FIG. 3 illustrates an embodiment of the model consultor and creator shown in FIG. 2.

Referring to FIG. 3, the process modeling system 270 is also termed to herein as a 'model consulter/creator' 270 for reasons that will become apparent. The model consulter/creator 270 includes a process simulator 300 such as the DEPICT™ photolithography simulator available from Technology Modeling Associates of Palo Alto, Calif. Other process simulators, of course, may be used in its place.

Process simulator 300 receives a plurality of process parameter sample signals, $PS_1$ through $PS_n$. Signals $PS_1$–$PS_n$ represent process parameters present for the process simulated in unit 300 at a given instant of time. The process simulator 300 responsively outputs signals 302 representing critical result values such as W (width), S (slope) and T (thickness) in the developed photoresist or etched underlying layer (e.g., in etched conductive layer 115).

Simulation result data 302 is stored in a simulation result storing memory 310. The simulation result storing memory 310 includes a Latin-hypercube driven region 312 whose function will be described later.

The output 311 of memory 310 drives a post-simulation calibratable-transform module 315. Once calibrated, the calibrated-transform module 315 operates according to multivariate correction equations to calibrate the simulation results (which are typically in terms of normalized values) so they correspond with actual values held in the sample-and-store unit 210 of FIG. 2.

The calibration transform parameters of the calibrated-transform module 315 are set by a calibrating comparator 314 during a calibration mode. As will be later explained, the calibrated-transform module 315 is preferably made responsive not only to the stored simulation output results 311 but also to one or more of the applied process parameter signals, $PS_1$ through $PS_n$, most particularly to the one representing focus ($PS_{focus}$).

The output 318 of the calibrated-transform module 315 provides multiple samples over time to statistical distribution plotter 320. The accumulated samples are used to generate a statistical distribution plot 325 of the results of plural simulations by process simulator 300 (or those of a faster equivalent unit 305 to-be described below).

A variance calculating module 340 then generates a variance output signal 345 representing the statistical variance $Var_O$ of the results of a given set of simulation runs. The results 345 of each set of simulations are stored in a variance storing memory 350.

The stored results 345 of plural simulation sets may be analyzed by a plurality of analyzing modules including a below-described, best leverage analyzer 370 and a prominent sigma analyzer 390. The stored results 345 of variance storing memory 350 are also accessible to the expert control unit 250 by way of interface 275 for carrying out other queries.

The inputs of the process simulator 300 may be driven from a number of sources.

A plurality of n routing switches 293 are provided for supplying process parameter samples from at least three different sources: (a) a simulated noisy-parameter source 290; (b) a calibration-mode real input 291; (c) and a Latin hypercube drive engine 292.

The simulated noisy parameter generator 290 includes in one embodiment, a first read/write storage means 285 for storing simulated variance values ($\sigma$'s) and a second read/write storage means 286 for storing simulated values of 'set' process parameters $P_1$ through $P_n$. The values stored in the first and second memory means, 285 and 286, are accessible by way of interface 275 for both reading and writing by the expert control unit 250 (FIG. 2). Read and write access to memory units 285 and 286 is also available to the best leverage analyzer 370 and the prominent sigma analyzer 390 by way of interface buses 273 and 274.

The sigma storing memory 285 can store at least two groups of variance values: $\sigma_{IN(1)}$ through $\sigma_{IN(n)}$ and $\sigma_{X(1)}$ through $\sigma_{X(n)}$. The first group of variances $\sigma_{IN(1)}$–$\sigma_{IN(n)}$ represents assigned in-scribe variances. The second group $\sigma_{X(1)}$–$\sigma_{X(n)}$ represents extrapolated cross-reticle variances.

A set of n routing switches 289 supply either the first variance set $\{\sigma_{IN(1)}$–$\sigma_{IN(n)}\}$ or the second variance set $\{\sigma_{X(1)}$–$\sigma_{X(n)}\}$ to a set of n random number generators (RNG) 288. The variance of each random number generator 288 is established by the respectively received variance value, $\sigma_{(1)}$–$\sigma_{(n)}$.

The respective random number sample output of each of generators 288 at a given time instant is supplied to a first input of a respective one of n summing units 289. The second input of each of the n summing units 289 receives a respective one of the 'set' process parameter values, $P_1$–$P_n$, stored in memory unit 286. The 'set' process parameters supplied by memory unit 286 are also referred to as the 'mean' process parameter values.

If desired, the illustrated noisy-parameter simulating system 290 may be replaced with a Latin-hypercube sampling system that generates an essentially equivalent statistical pattern of noise-infected process parameter values. In such a case, the number of Latin hypercube sampling runs should be a large number, such as 799, to assure that a statistically meaningful result is obtained from the corresponding set of noisy simulations.

In the case where the process parameter selecting switches 293 are in a first position (A) and the illustrated following group of n bypass switches 295 are in a direct-connect position (D), the noisy process parameters produced by simulator 290 are routed to process simulator 300. Process simulator 300 then evaluates the received inputs and generates corresponding result values 302 which are stored in the result memory 310.

A large number of simulation runs are performed in order to store a statistically significant number of results in the result storage memory 310. The number of simulated runs is preferably on the order of 100 to 200, more preferably on the order of 400 runs, and even more preferably on the order of 800 or more runs.

Each run of the process simulator 300 takes a relatively long amount of time. It takes a corresponding multiple of that one-run time to perform the desired 100 to 800+ large number of noise-infected simulations.

It was found that the time for gathering simulated result samples could be significantly reduced by bypassing the slow-to-evaluate process simulator 300 and instead using a response surface modeler (RSM) in combination with a kriging error-correction interpolator. The combination of the RSM and kriging interpolator is referenced as block 305 in FIG. 3. A neural net modeler could be used in place of the RSM/kriging module 305 if desired and trained to produce similar results.

To program the RSM portion of module 305, the parameter selecting switches 293 are first set to drive position (C). A relatively small Latin-hypercube drive engine 292 or its equivalent then supplies a regular matrix of parameter samples over time for filling in a corresponding result region 312 in the result storing memory 310. In one particular embodiment, the Latin hypercube drive engine 292 was designed to provide 51 runs through the slow-to-evaluate simulator 300 in order to produce the pre-simulated data of result region 312.

The response surface modeler (RSM) then scans result region 312 and develops a surface model for the data contained in that region 312. Error between the modeled surface and the actual data contained in region 312 is corrected by the kriging interpolator.

Next, the parameter source selecting switches 293 are reset to position (A) and the bypass switches 295 are set to bypass position (E). The larger number (e.g., 800 or so) of noisy simulation runs are processed through the RSM/kriging module 305 rather than through the slow-to-evaluate simulator 300. Results are produced much faster for storage in simulation result storing memory 310. This means that more queries can be processed in a given time period. The overhead for this performance gain is the 51 or so additional runs for generating mapping region 312 with the LH engine 292.

In order to calibrate the post-simulation transform module 315, the parameter source selecting switches 293 are thrown into calibration position (B). Accurately measured process parameters from the real processing line 202 are fed in through connection 291 and the actually-observed results are supplied through calibration output feed 278 (from the sample and store memory 210 of FIG. 2). Comparator 314 is activated and operates to find the transform parameters that minimize the error between the actual results 278 and the simulated results 311.

Any one of a number of calibration and correction transforms may be used including a linear least-squares method. Examples of a set of linear calibration transforms are shown in FIGS. 6A–6F.

Figure 6B:
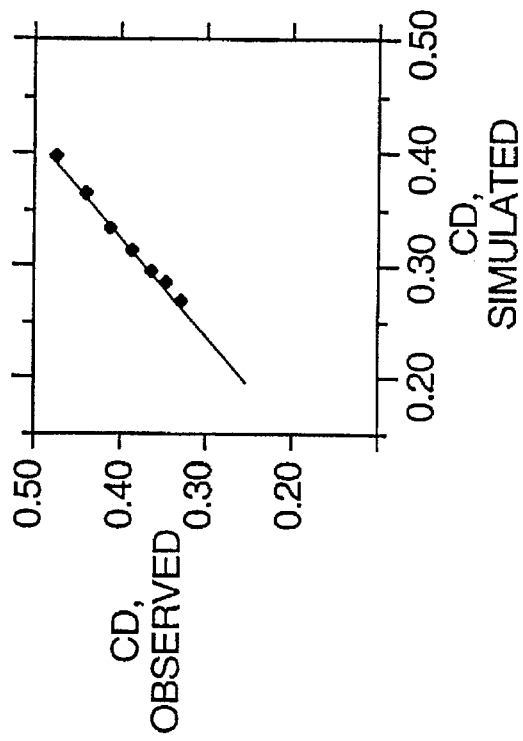
FIGS. 6A through 6F illustrate how calibration may be carried out.
Figure 6A:
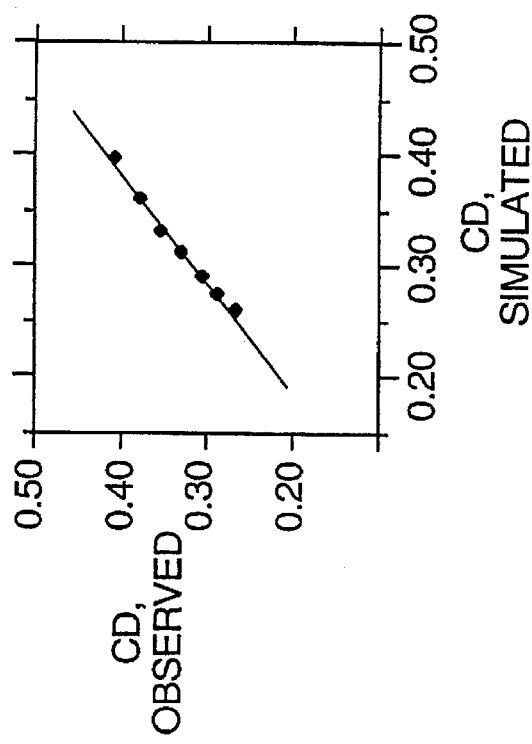

FIG. 6A shows the calibration results for densely-packed 0.35μ lines while the focus of the stepper remains fixed at −0.6 microns. FIG. 6B shows the corresponding results for isolated poly lines within the in-scribe region. Note that each result is fairly linear.

Figure 6D:
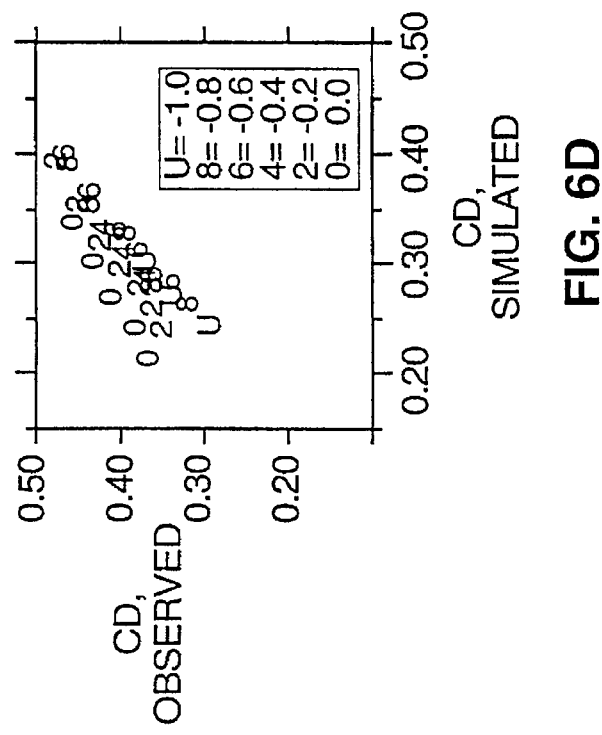
Figure 6C:
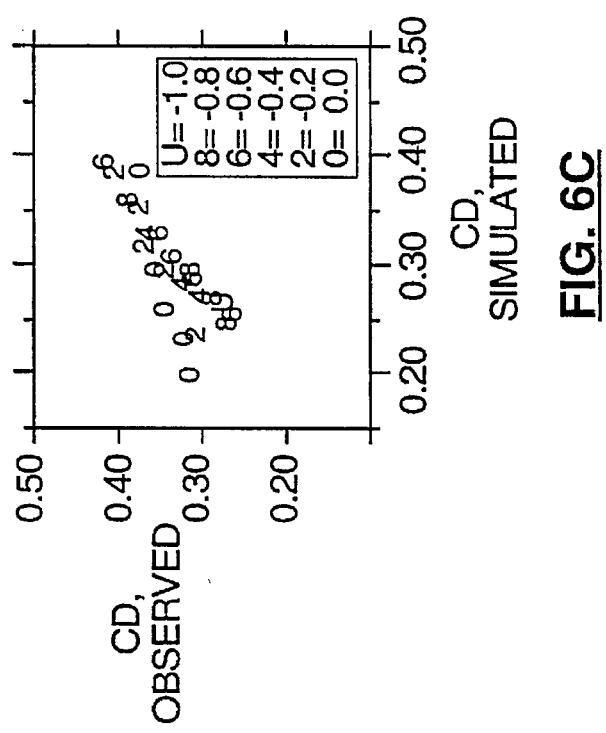

Referring to FIGS. 6C and 6D, the slope of the linear approximations change as the mean focus parameter changes.

Figure 6E:
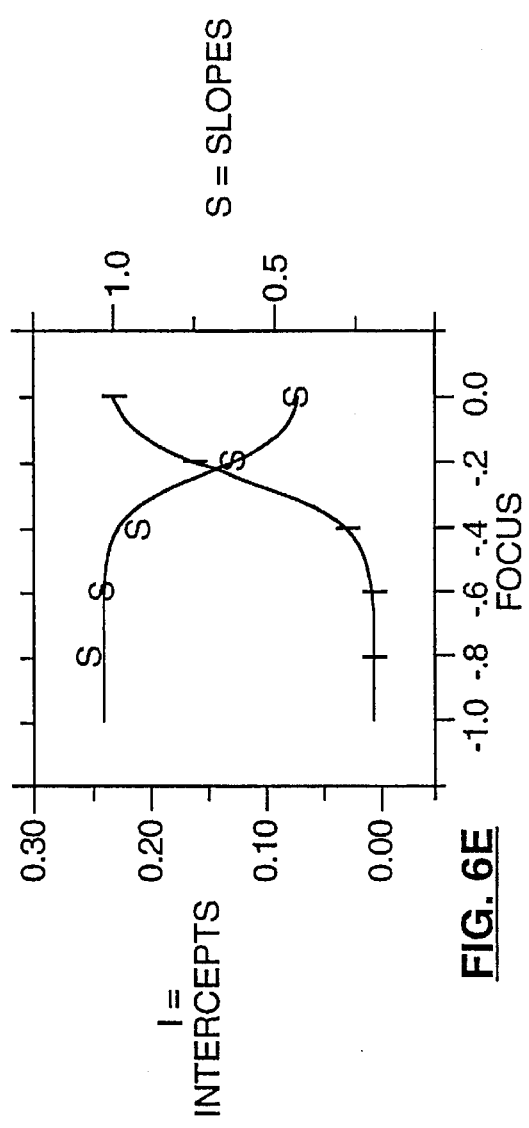
Figure 6F:
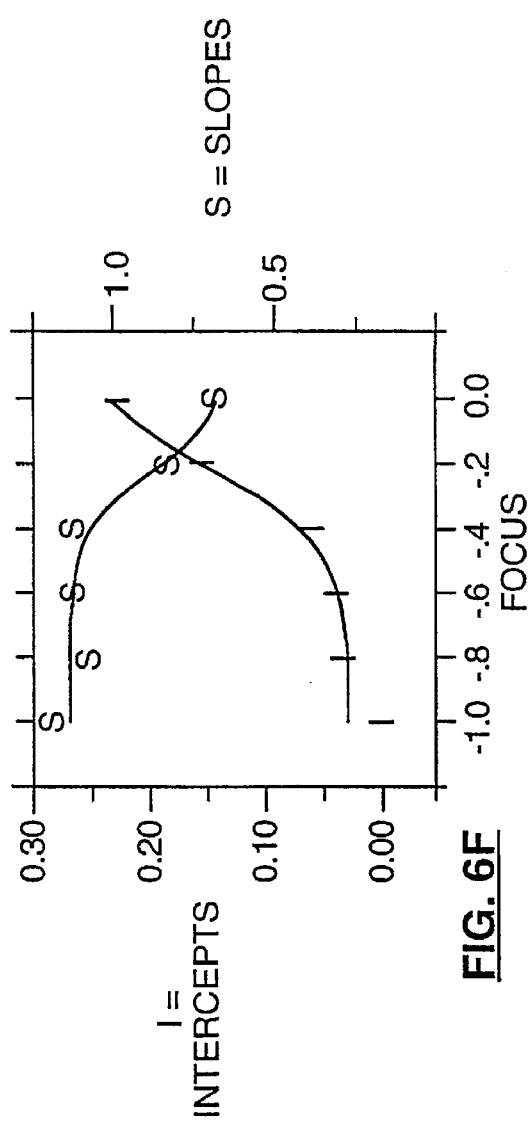

Referring to FIGS. 6E and 6F, there is shown respectively for dense and isolated lines, the slope and intercept values for each linear transform as a function of stepper focus. To provide a generic post-simulation calibration for all values of focus, it is preferable to connect transform module 315 to also receive the focus parameter $PS_{focus}$ from the input to switch set 295 so that the corrections of FIG. 6E and 6F can be automatically carried out by module 315 for any value of focus.

Referring briefly to FIG. 4, there is shown the traditional 5-point sampling pattern from the top view of a wafer in solid lines and the 9-point sampling pattern with the added dashed lines.

Each sample measurement collects the linewidth value W of an isolated sacrificial poly line (or of the corresponding developed photoresist feature) within the in-scribe area 108. Two wafers are sampled from each lot thereby providing, in the case of 5-point sampling, ten data points per lot. A large number of lots on the order of 100 or more should be sampled in order to provide statistically meaningful information. The results are stored in the sample-and-store memory 210 of FIG. 2 and subsequently analyzed by statistical distribution profiler 220 and variance calculator 240.

The expert control unit 250 compares the actual production line statistics 225 against the acceptable distribution 265 defined by unit 260. At this time, the matched process model 280 which in FIG. 3 includes at least the process simulator 300, the result storing means 310 and the transform module 315, has already been precalibrated to match the results of the actual fabrication line 202. Process model 280 preferably also includes the RSM/kriging module 305 so that it may perform simulations at a faster pace.

The expert control unit 250 may consult with the model consulter/creator unit 270 to determine what setting of process parameters and corresponding tolerance allowances within the actual fabrication line 202 are most likely to drive the actual statistics 225 into agreement with desired statistics 265.

Figure 5:
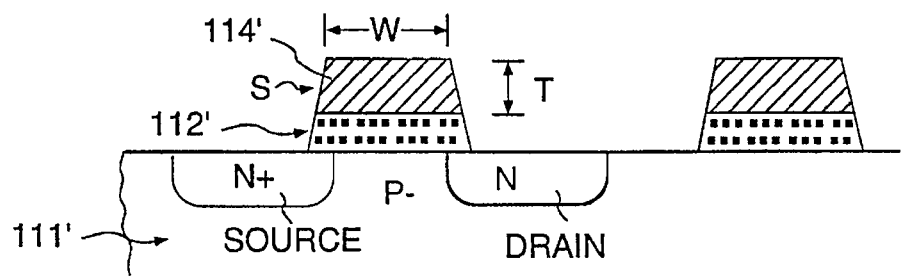
FIG. 5 is a cross-sectional view of in-die transistors.

Referring briefly to FIG. 5, there is shown a cross-sectional view of an IGFET fabricated by means of process 202. After the width (W), slope (S) and thickness (T) of polysilicon 114' is defined by the etching step, a self-aligned doping implant creates the source and drain regions in substrate 111'. Oxide portion 112' defines the gate oxide. The effective channel length is a function of the critical dimensions, W, S and T, of the polysilicon line 114'.

Referring again to FIG. 3, during a predictive simulation run (wherein simulated noisy parameter generator 290 drives process simulator 300 many times), the mean and variance data stored respectively in memory units 286 and 285 are empirically set.

Table-1A illustrates an example for determining by simulation, the critical dimensions for fabricating a 0.50 micron linewidth logic design, where the layout has symmetrical 1.0 micron pitch between lines. The left side of Table-1A shows the data values for each respective process parameter and the corresponding variance (three standard deviations) as set for the in-scribe isolated polysilicon lines.

Empirical evidence shows that although the stepper focus may be 'set' to a depth of 0.3 microns below the photoresist surface 119, the actual focus may drift by as much as 0.3 microns in either direction (up or down). Thus, the actual focus may be as deep as −0.6 or as shallow as 0.0 microns relative to the photoresist top surface 119.

Exposure dosage is shown in Table-1A in terms of milliJoules per centimeter squared. Diffusion length is expressed in terms of microns. Development time is expressed in terms of minutes. The minimum mask critical dimension is expressed in terms of microns. Photoresist thickness is expressed in terms of microns. Antireflective coating thickness is expressed (for later discussed Table-2A) in terms of Angstroms. Phase shift angle is expressed in terms of degrees. The partial coherence of the radiating source 170 is also sometimes referred to as the sigma of the radiating light.

For those process parameters that do not have specified variances (n/a), a variance of zero is assumed.

Figure 7:
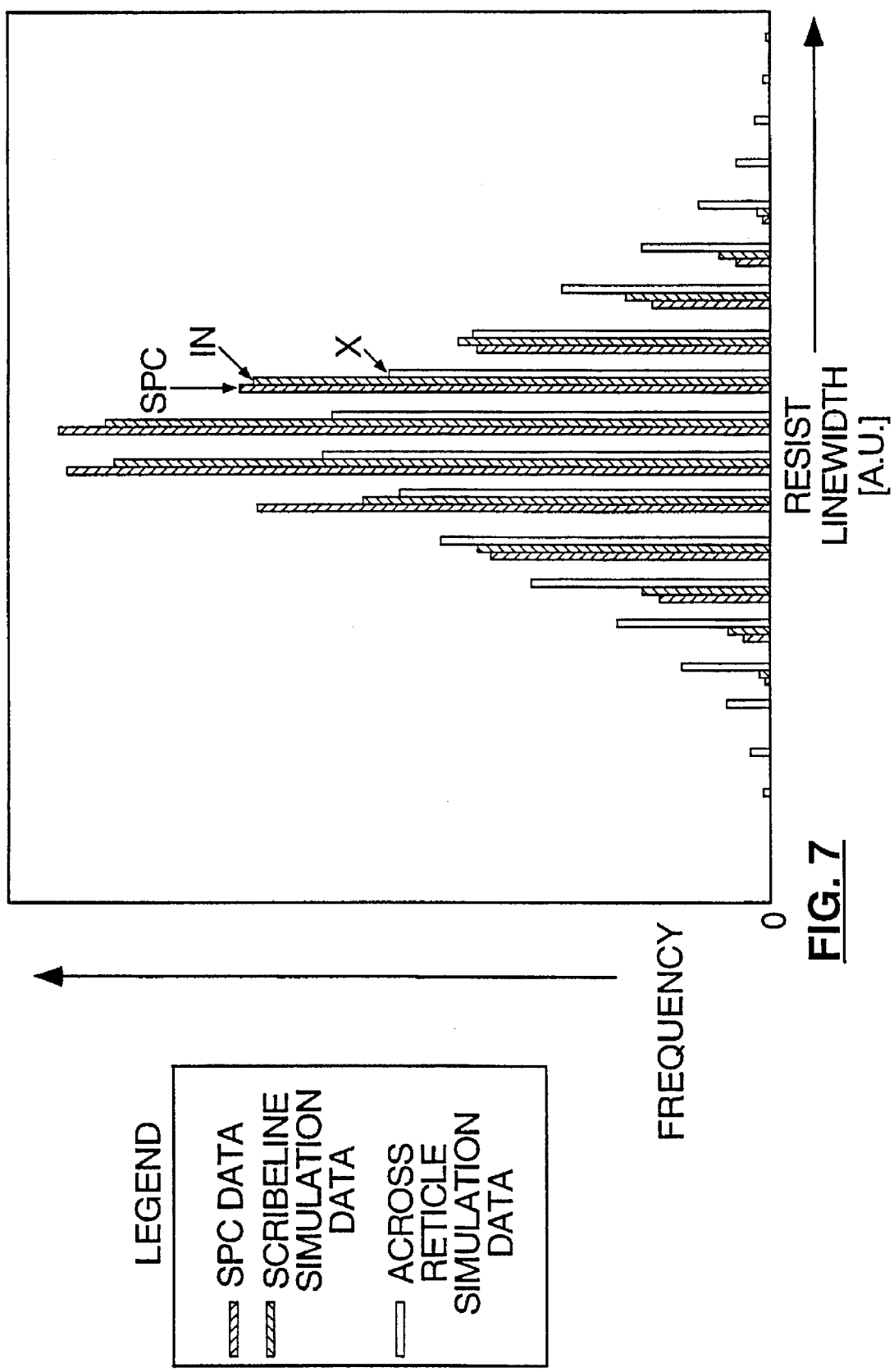
FIG. 7 is an overlay of three histograms respectively for actual in-scribe measurements (SPC), simulation predicted in-scribe results (IN), and simulation predicted cross-reticle results (X)

Referring to FIG. 7, an overlay of three distribution histograms is shown. The black bars labeled SPC data show actual in-scribe measurements collected from the fabrication line for the 0.50μ technology. The cross-hatched bars labeled Scribeline Simulation Data represent the results of our matched process model 280 using the in-scribe data values shown in Table-1A. As can be seen, there is a relatively close match between the statistical distributions of the actual in-scribe data (SPC) and the simulation result data (IN).

This comparison constitutes a reality check showing that the simulation results are closely matched to actual production statistics and the statistical behavior of the process modeler 280 matches that of the real processing line 202 at least for the utilized process parameter values and corresponding circuit layout.

The corresponding structure for performing the reality check between actual and simulated mass-production statistics is shown in FIG. 3 as comparator 326. A first input of comparator 326 receives the plot 225 (FIG. 2) of the actual production statistics along bus 276 from distribution plotter 220. A second input of comparator 326 receives the simulated plot 325 from distribution plotter 320. The output of comparator 326 is tested to assure there is a fairly close match between the simulated in-scribe results and the actual in-scribe results. If there is a large disparity, the input settings for the process simulator 300 and the calibration settings for transformation module 315 should be modified to provide a better match between the statistical behavior of the process model 280 and that of the actual fabrication line 202.

Referring again to FIG. 7 and Table-1A, practical considerations prevented the collection of actual cross-reticle measurements from the production line. However, empirical engineering knowledge was used to assign to selected process parameters, cross-reticle variances values that are greater than those of the in-scribe values. The selectively increased variance values are underlined in the right column of Table-1A.

By way of example, the lens curvature variance as prescribed by lens supplier 156 was added to the in-scribe focus variance to provide a cross-reticle 3-standard deviations amount of 0.6 microns. This new focus variance which is shown underlined at the right side of Table-1A represents the expected increase in parameter variance across the reticle as opposed to the variance present within the in-scribe area 108. This means that actual focus can drift as high as +0.3μ above the photoresist top surface 119 at the 3σ point in the case where the mean focus is 'set' at −3.0μ.

No change in variance for cross-reticle parameters are expected in this particular example for exposure dosage, diffusion length, development time, numeric aperture and partial coherence. Accordingly, all of these values were kept the same for the cross-reticle simulation of Tables-1A, 2A, 3A.

The three-times larger variance for the mask critical dimensions is specified by the mask manufacturer for densely packed lines as opposed to isolated lines.

The five-times increase in variance for cross-reticle PR thickness is empirically attributed to the non-planar topology found within the in-die area 109 as a result of the presence of field oxide and other non-planar features.

As can be seen in Table-1A, the variances of selected process parameters were increased to correspond with the associated physical attributes across the reticle field in order to predict without measurement the cross-reticle statistical distribution.

The stimulation-predicted cross-reticle distribution histogram is shown as the white bars in FIG. 7 labeled 'X'. As can be seen, the cross-reticle simulated distribution maintains a Gaussian form following that of the actual in-scribe data but having a shallower mean.

Table-2A shows similar settings for a 0.35 micron logic technology. The variance increase due to lens curvature remains the same as for the 0.50 micron technology when extending from in-scribe measurements to expected cross-reticle results. The cross-reticle variance for the mask CD is three times that of the in-scribe region. The cross-reticle variance for the photoresist thickness is five times that of the in-scribe region. In the case of 0.35 micron technology, the logic simulator 300 also accounts for phase shift variance as prescribed by the mask supplier 166.

Table-3A shows the in-scribe and cross-reticle values used for simulating 0.35 micron technology for densely packed circuits such as found in memory circuits. Here, an asymmetrical pitch of 1.0μ on one side and 0.72μ on the other side of lines is used.

The expert control unit 250 can use the model consulter-creator 270 to identify the key contributors to overall process variance for a given circuit design and processing line 202 once the matched process model 280 has been calibrated.

Key contributor identification is carried out with the aid of the prominent signal analyzer 390 of FIG. 3. Process parameters are selected one at a time by the prominent signal analyzer 390 and the variance of the selected process parameter is temporarily reset to zero (by programming the sigma storing memory 285). The noisy set of simulations is re-run and the new total variance $Var_O$ is calculated by variance calculator 340 and stored within variance storage memory 350 while still retaining the variance value of an original first run where none of the relevant variances were reset to zero.

The prominent sigma analyzer 390 then subtracts the new variance from the old variance (the old being the result where the variance of the selected process parameter was not reset to zero). This produces a delta variance value. The delta variance value is placed over the original variance value ($\Delta V/V$) to generate a percent contribution value attributed to the selected process parameter.

Table-1B summarizes the simulation results for a 0.5 micron technology referred to as 'A'. As can be seen, exposure dosage contributes roughly 38% to the total variance of the cross-reticle distribution in a dense-line design. Photoresist thickness is the next most prominent contributor, giving approximately 30% to the total variance for cross-reticle dense-line distribution.

Given the results of Table-1B, the conclusion is drawn for technology A that the most attention should be given to controlling exposure dosage variance in the corresponding dense-line circuit design. Driving exposure dosage variance down to zero provides a 38% improvement for the overall cross-reticle variance of a dense-line circuit layout as shown by Table-1B.

For a circuit layout where line packing is relatively isolated rather than dense, the situation flip-flops. Photoresist thickness variance provides approximately 53% of the contribution to total cross-reticle variance. So, depending on the density of lines in the cross-reticle situation, the expert control unit 250 may choose to modify the process parameters of the actual fabrication line 202 selectively for the exposure dosage of module 100 or selectively for the PR thickness of coating module 101.

Table-2B summarizes the key contributors of variance for a 0.35 micron technology 'B' as affecting line width (CD) and line slope respectively for dense line without phase shift, isolated line without phase shift, dense line with 180° phase shift and dense line with different variations of phase shift angle.

Table-3B is similar to Table-2B except the results are extrapolated for cross-reticle contributions.

Referring again to FIG. 3, the best leverage analyzer 370 modifies the process parameter values stored in memory modules 285 and 286 but uses a different algorithm than that of the prominent signal analyzer 390. Each of the process parameters is selected one at a time and tweaked by roughly 10%. The change between simulated old and new variance is recorded. Then the process parameter which provided the most beneficial improvement (greatest decrease) in total simulated variance is identified and designated as the best-leveraging parameter. The change for that parameter is kept together with the corresponding new variance value which now becomes the old value for the next incremental run. Then the tweaking process is repeated again looking for the next process parameter that is the best leveraging one.

FIGS. 8A and 8B illustrate the results of such an incremental leveraging process. As seen in FIG. 8A, the goal of the operation is to reduce the 3 g value for the overall process from 0.20 to 0.10 micron.

In FIG. 8B, the first run of the best leveraging analyzer 370 pinpoints the variance of the focus as the tightening factor which provides the most beneficial improvement. Development time and mask CD remain constant over the first 5 increments (measured along horizontal axis). At the sixth increment, development time provides the most beneficial improvement. Best beneficial improvement from mask critical dimension variance does not kick in until the 15th increment. The goal for the total variance of the production line is reached at the 12th increment however by flip-flopping tightenings the development time and the focus parameters. The tolerances within the actual production line 202 are therefore accordingly tightened without asking the mask supplier to provide masks of tighter tolerance.

In the specific run of FIGS. 8A–8B, we assume 2 percent exposure dose control. At every increment along the x-axis, each noise factor is tightened in turn by 10 percent. That noise factor giving the greatest reduction of CD variation is selected for permanent tightening. The predicted CD from such tightening is plotted on the upper panel of FIG. 8A; the tightening multiplier for that noise factor is plotted on the lower panel of FIG. 8B.

The operation sweeps through 20 such improvement increments. We can see that for the first five increments, the factor with greatest leverage is focus, for the next two, development time, and so on. In total, focus is assigned 7 improvement increments and development time 5 before we achieve 10 percent (3 sigma) linewidth control. We achieve this level by tightening focus by a factor of 0.48 ($-0.9^7$) and development time by a factor of 0.59 ($=0.9^5$). Of course, were exposure control assumed initially to vary by 10 and not 2 percent, this method would reveal a dominant need for greater exposure dose control.

Although the best leveraging techniques of FIGS. 8A and 8B are applied to variance tightening, a similar approach may be taken to selecting the best goal settings for the 'mean' process parameters such as focus depth and PR thickness. Thus, if something goes wrong on the production line after new equipment has been installed, line operators can use the results of the model consulter 270 to determine which process parameter requires tweaking first and by how much. The expert control unit 250 may be allowed to perform such tweaking automatically, if desired, by way of control bus 255.

TABLE-1A 0.50 μm Technology A (LOGIC)

| Factor | In-Scribe | | Cross-Reticle | |
|---|---|---|---|---|
| | Mean value | 3 St. Dev. | Mean value | 3 St. Dev. |
| Focus [μm] | −0.3 | 0.3 | −0.3 | 0.6 |
| Exp. Dose [mJ/cm**2] | 180 | 18 | 180 | 18 |
| Diff. Length [μm] | 0.04 | 0.02 | 0.04 | 0.02 |
| Dev. Time [min] | 1 | 0.1 | 1 | 0.1 |
| Mask CD [μm] | 0.50 | 0.0050 | 0.50 | 0.0150 |
| PR Thickness [μm] | 1.01 | 0.005 | 1.01 | 0.025 |
| Numeric Aperture | 0.6 | n/a | 0.6 | n/a |
| Partial Coherence | 0.56 | n/a | 0.56 | n/a |

TABLE-2A 0.35 μm Technology B (LOGIC)

| Factor | In-Scribe | | Cross-Reticle | |
|---|---|---|---|---|
| | Mean value | 3 St. Dev. | Mean value | 3 St. Dev. |
| Focus [μm] | −0.3 | 0.3 | −0.3 | 0.6 |
| Exp. Dose [mJ/cm**2] | 180 | 18 | 180 | 18 |
| Diff. Length [μm] | 0.04 | 0.02 | 0.04 | 0.02 |
| Dev. Time [min] | 1 | 0.1 | 1 | 0.1 |
| Mask CD [μm] | 0.35 | 0.0035 | 0.35 | 0.0105 |
| PR Thickness [μm] | 1.01 | 0.005 | 1.01 | 0.025 |
| ARC Thick. [Å] | 370 | 37 | 370 | 37 |
| ARC Refract Indx | 2.5 | n/a | 2.5 | n/a |
| Phase Shift Angle | 180 | 5 | 180 | 5 |
| Numeric Aperture | 0.6 | n/a | 0.6 | n/a |
| Partial Coherence | 0.56 | n/a | 0.56 | n/a |

TABLE-3A 0.35 μm Technology C (DENSE MEMORY)

| Factor | In-Scribe | | Cross-Reticle | |
|---|---|---|---|---|
| | Mean value | 3 St. Dev. | Mean value | 3 St. Dev. |
| Focus [μm] | −0.4 | 0.3 | −0.4 | 0.6 |
| Exp. Dose [mJ/cm**2] | 170 | 17 | 170 | 17 |
| Diff. Length [μm] | 0.025 | 0.01 | 0.025 | 0.01 |
| Dev. Time [min] | 1 | 0.1 | 1 | 0.1 |
| Mask CD [μm] | 0.36 | 0.0036 | 0.36 | 0.0108 |
| PR Thickness [μm] | 1.01 | 0.005 | 1.01 | 0.025 |
| ARC Thick. [Å] | 400 | 40 | 400 | 40 |
| ARC Refract Indx | 2.5 | 0.025 | 2.5 | 0.025 |
| Phase Shift Angle | 180 | n/a | 180 | n/a |
| Numeric Aperture | 0.54 | n/a | 0.54 | n/a |
| Partial Coherence | 0.62 | n/a | 0.62 | n/a |

TABLE-1B

| PROMINENT VAR CONTRIBUTOR FOR 0.5μ TECH. A | | | | |
|---|---|---|---|---|
| | In-Scribe | | Cross-Reticle | |
| Factor | Dense line | Iso line | Dense line | Iso line |
| Focus [%] | 2.79 | 4.18 | 7.98 | 9.99 |
| Mask CD [%] | 0.25 | 0.03 | 3.53 | 0.5 |
| PR Thick. [%] | 4.8 | 12.92 | 30.55 | 52.77 |
| Exp. dose [%] | 62.54 | 55.8 | 38.39 | 24.11 |
| Diff. Length [%] | 12.16 | 4.62 | 6.39 | 1.52 |
| Dev. Time [%] | 18.89 | 25.2 | 12.46 | 12.37 |

TABLE-1B-continued

PROMINENT VAR CONTRIBUTOR FOR 0.5µ TECH. A

|  | In-Scribe | | Cross-Reticle | |
|---|---|---|---|---|
| Factor | Dense line | Iso line | Dense line | Iso line |
| Normalized mean | 0.97 | 1.0003 | 0.972 | 0.996 |
| Normalized st. dev. | 1.266 | 1.074 | 1.6 | 1.622 |

TABLE-2B

PROMINENT VAR CONTRIB FOR IN-SCRIBE 0.35µ TECH.

| | Dense line | | Iso line | | Dense with phase shift | | Dense with variable PS | |
|---|---|---|---|---|---|---|---|---|
| Factor | CD | Slope | CD | Slope | CD | Slope | CD | Slope |
| Focus [%] | 8.83 | 82 | 9.22 | 79.22 | 11.26 | 54.77 | 0.76 | 45.74 |
| Exp. dose [%] | 64.34 | 13.21 | 76.86 | 8.14 | 67.22 | 25.33 | 74.35 | 42.28 |
| Diff. Length [%] | 3.53 | 2.11 | 1.93 | 10.71 | 2.73 | 15.56 | 9.39 | 4.41 |
| Dev. time [%] | 13.97 | 1.85 | 10.3 | 0.28 | 11.7 | 7.21 | 9.44 | 4.73 |
| Mask CD [%] | 0.71 | 0.03 | 0.59 | 0.06 | 0.86 | 0.01 | 1.18 | 0.11 |
| PR Thick. [%] | 0.03 | 0.01 | 0.01 | 0.01 | 0.05 | 0.14 | 0.26 | 0.19 |
| ARC Thick. [%] | 10.13 | 5.49 | 4.6 | 4.18 | 10.05 | 4.27 | 12.05 | 5.98 |
| Phase angle [%] | n/a | n/a | n/a | n/a | n/a | n/a | 0.07 | 0.79 |
| St. Dev./Mean [%] | 4.75 | 17.39 | 3.94 | 20.29 | 4.48 | 15.44 | 5.87 | 10.14 |

TABLE-3B

Across reticle field

| | Dense line | | Iso line | | Dense with phase shift | | Dense with variable PS | |
|---|---|---|---|---|---|---|---|---|
| Factor | CD | Slope | CD | Slope | CD | Slope | CD | Slope |
| Focus [%] | 7.23 | 79.39 | 7.73 | 77.69 | 9.82 | 51.22 | 7.02 | 79.03 |
| Exp. dose [%] | 66.17 | 16.08 | 77.64 | 10.32 | 67.89 | 29.94 | 63.25 | 16.46 |
| Diff. Length [%] | 2.94 | 1.97 | 1.7 | 10.29 | 2.19 | 14.15 | 8.71 | 1.6 |
| Dev. time [%] | 11.79 | 1.78 | 8.66 | 0.15 | 9.89 | 6.86 | 7.77 | 1.34 |
| Mask CD [%] | 4.3 | 0.002 | 3.88 | 0.19 | 5.27 | 0.01 | 8.61 | 1.06 |
| PR Thick. [%] | 0.28 | 0.03 | 0.02 | 0.04 | 0.35 | 0.1 | 2.07 | 1.11 |
| ARC Thick. [%] | 8.2 | 5.32 | 3.8 | 4.11 | 8.07 | 4.02 | 11.02 | 2.04 |
| Phase angle [%] | n/a | n/a | n/a | n/a | n/a | n/a | 0.11 | 0.49 |
| St. Dev./Mean [%] | 5.28 | 17.7 | 4.2 | 20.56 | 5.04 | 15.97 | 6.46 | 16.13 |

In summary, an approach has been shown with the following elements:

(a) Simulations use the DEPICT™ module or its equivalent to extract CDs and slopes. {See above-cited reference paper number (3)}.

(b) Deliberately varied input ("noise") factors are added to the stepper parameters (focus, exposure energy), to the photoresist parameters (thickness, post-exposure bake, diffusion length), to the developer parameters (time), to the parameters of the underlying films (thickness, refractive index) and to the parameters of the mask (CD, phase shift angle).

(c) A statistical form of calibration is used to match the process model to the actual processing line. {See above-cited reference paper number (4)}. Empirical measurements are correlated with the corresponding simulator predictions and used to determine a post-simulator transformation of the DEPICT™ results. {See above-cited reference paper number (5)}.

(d) An indirect modeling approach is used to bypass the time limitations of slow-to-evaluate simulators. In one example, 51 DEPICT simulations are run to define an interpolation grid following a Latin hypercube design. {See above-cited reference paper number (5)}. A kriging interpolator is used in combination with a response surface modeler. {See above-cited reference paper number (7)}.

(e) A 799-run Latin hypercube sampler {See above-cited reference paper number (8)} or an equivalent noisy parameter generator is used to estimate the CD distribution of the end product.

(f) The estimated CD distribution is supplemented with decompositions of the total manufacturing distribution into variance components. {See above-cited reference paper number (9)}.

(g) Selective distribution settings are employed for each process parameter variance so that the range of each unmeasurable noise factor is adjusted to produce overall results matching those of physical observations.

Stated more compactly: our methods have the following elements: (a) Using DEPICT™, we model gate CD using a moderate number of noise factors. (b) For simulator calibration, we attempt to follow a classical straightline formulation, and transform the simulator observations to best predict the results of empirical experiments. A single straight line is not quite adequate, and we adapt accordingly by compensating slope and intercept in response to focus. (c) We use an indirect modeling approach appropriate for slow-to-evaluate simulators: Following a Latin hypercube design, we run 51 direct DEPICT simulations to define an interpolation grid. Then we combine a conventional response surface model (for a descriptive approximation) and a kriging interpolator (with respect the residuals). This model we evaluate for various 799-run Latin hypercube samples, estimating the long term manufacturing distribution. (d) These distributions we refine two ways. First, we decompose the total variance into components associated with each noise factor. Second, as needed, we derive new, tighter tolerances to achieve the development goals.

In terms of implementation details specifically for the DEPICT™ simulator version 3.0, resist exposure parameters {See above-cited reference paper numbers (10) and (11)} were as follows: a=0.84/µm, b=0.03/µm, and c=0.016 cm$^2$/mJ. The contribution from post exposure bake was calibrated for by distribution matching: The diffusion length distribution was chosen to match the standing wave patterns from such experiments. Although somewhat subjective, our choice does match a range of empirical results.

The contribution from resist development is accounted for by proxy: The resist parameters are fixed, but develop time is varied. Although 10 percent development time variation may seem too large, its value attempts to accommodate the effects of queuing and multiple stepper-track interfaces. For the 0.5 micron technologies, this proves acceptable. The development parameters {See above-cited reference paper number (12)} are these: r.max=7.2 µm/min, r.min=0.006 µm/min, selectivity=5.44, and threshold PAC concentration=−100.

For the two 0.35 micron technologies, the noise factors are outlined in Tables 2A and 3A. Note that different standard deviations are assumed for the scribe line monitors and across the whole reticle field. In the latter case, one has to take into account the curvature of the lens, the topography effects on photoresist thickness, and the CD variations across the mask. Unless specified, we do not assume a broader exposure dose across the field, since this effect is confounded with stepper-to-stepper variations. Focus is measured from the top of the photoresist.

When simulated, for the anti-reflective coating (ARC), both the refractive index (RI) and its thickness are varied. For phase shift masks, the phase shift angle is varied according to manufacturer specifications.

For the calibration of the process model for each circuit technology, we obtain dense and isolated line CD measurements across a matrix of focus and exposure settings. In addition, matched to each empirical measurement, we obtain the corresponding prediction from DEPICT™.

For the 0.5 micron technology, the empirical CD measurements fit well as a straight line with DEPICT's predictions.

For the 0.35 micron technology, this was found not to be the case. For each focus value, the empirical measurement-DEPICT simulation values is still linear (FIGS. 6A, 6B). However, the form of this linear relationship changes as focus changes (FIGS. 6C, 6D); measurements and simulations at nominal focus have different slopes and intercepts than those with focus at −0.5 microns. FIGS. 6E, 6F plot the slopes and intercepts of these linear relations for each focus. The pattern is curvilinear, monotone, and indeed, consistent with the functional form of Fermi-Dirac. To derive the calibration relationship, we model the empirical measurements as linear functions of the simulator result, one whose intercept and slope are Fermi-Dirac functions of focus. The smooth curves in FIGS. 6E, 6F are the result. The models fit comparably to what is achieved by fitting each focus group separately ($R^2 > 0.99$).

With these calibration relationships, we transform all DEPICT™ CD results, whose focus value is always known, into predictions of empirical measurements.

For predictive estimation of distributions using the calibrated simulator, in principal one can vary the input factors following appropriate manufacturing distributions, for instance using Monte Carlo methods. The greater accuracy of Latin hypercube sampling (LHS) over Monte Carlo is established theoretically. {See above-cited reference paper number (13)}. For simulators requiring little CPU time per evaluation, such as differential equations in the environmental field, LHS is appropriate. {See above-cited reference paper number (14)}.

Our approach is more suitable for slow-to-evaluate simulators, typical of numerically intensive simulators such as DEPICT™. The basic idea is to apply LHS to a faster, approximate version, and involves three steps:

(1) Establish an interpolation grid: In our case, we ran 51 runs of a Latin hypercube design varying all noise factors. The noise factors are spread uniformly over the broader, across-the-field range.

(2) Model each response: (a) Each response is modeled using stepwise regression with respect to a conventional response surface model. (b) Then, the residuals from each model are predicted using kriging, a general purpose, least-squares-optimal multivariate interpolator. Predictions are the sum of the regression and kriging models. (c) Finally, as available, predictions are transformed using the appropriate calibration curve, which, for the 0.35-micron lines, are conditional on focus value.

(3) Apply LHS to the regression-plus-kriging interpolator: The Latin hypercube we use consists of 799 runs, whose factors are spread as Gaussian distributions. We use one Latin hypercube for estimating within-scribe distributions, where the position in the reticle field is fixed, and another for estimating across-field distributions, where the position in the reticle is considered to vary.

It is convenient to summarize the 799 runs with normal probability plots, examples of which are in FIG. 9A, 9B; unlike histograms, these avoid artifacts imposed by arbitrary binning. These plot the observed response versus the expected percentlie from a standard Gaussian distribution. The pattern is therefore constrained to be monotone, and straight lines indicate consistency with the Gaussian distribution. Horizontal shifts indicate a change in location, slopes are inversely proportional to the standard deviation. In the case of FIGS. 9A, 9B, we observe the across-field distributions (□ symbols) are controlled to about ±8 percent three sigma, within-scribe distributions (○ symbols) to about ±6 percent. Gaussian distributions fit quite well, although the across-field distributions show some skewness in the lower tail.

From the results shown in Table-1B, we see the across-field distributions are broader by as much as 60 percent. Judicious technology planning ought to accommodate this. Table-1B also shows the relative contributions of each noise factor to the total standard deviation, calculated by analysis of manufacturing variance (AMV). {See above-cited reference paper number (7)}. For in-scribe line distributions, the principal contributions are from exposure and resist development control. The situation changes when the topography effects of resist thickness are included; across the field, photoresist thickness dominates even over exposure dose. Although flat wafer photoresist thickness control is excellent, topography will usually make resist thickness the main culprit for resist linewidth variation. To alleviate this problem, one should use anti-reflective coating (ARC).

The noise factors for scattered and dense 0.35 micron layout technologies appear in Tables 2A and 3A.

In Tables 2B and 3B there are shown the uncalibrated results for technology A. Both dense and isolated CDs are affected primarily by exposure dose variation, while profile slopes are affected mostly by focus variation. Because of the ARC layer, photoresist thickness is no longer a significant contributor. This is in contrast to the 0.5 micron technology, which, sensitive to resist thickness control, had a much larger standard deviation. The addition of ARC helps considerably.

Also investigated is the potential benefit of phase shift masking. From Tables 2B, 3B we observe the following: (a) With a perfectly controlled alternating phase shift mask (phase angle=180°), there is noticeable improvement. (b) Taking into account phase angle variations results in a net larger standard deviation. Phase angle variations sensitize the process to variations in the resist stack.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be defined by the claims appended hereto.

What is claimed is:

1. A wafer processing system comprising:
(a) a mass-production line that processes wafers that are to have a mask-defined circuit layout, said processing occurring on a mass-production basis;

(b) sample-and-measure means for sampling processed wafers flowing through the mass-production line and for measuring and storing the values of critical dimensions of the sampled wafers;

(c) a machine-implemented, matched process model that is calibrated by use of the stored values of critical dimensions of the sampled wafers to model the behavior of the mass-production line with respect to the mask-defined circuit layout;

(d) consultor means for consulting the matched process model to predict the statistical behavior of the mass-production line for large numbers of wafers at various settings of process parameters and various tolerance allowances in those process parameters; and (e) expert control means, operatively coupled to the sample-and-measure means, to the consultor means, and to the mass-production line, for detecting undesired variances in the statistical distribution of the processed wafer outflow of the mass-production line, for querying the consultor means to identify the most likely contributing causes for said undesired variances, and for responsively adjusting the settings of process parameters and/or the tolerance allowances of those process parameters that are identified as being the most likely contributing causes for said undesired variances;

(d.1) wherein said consultor means includes a best leveraging analyzer.

2. A wafer processing system according to claim 1 wherein said mass-production line includes a stepper and a development station.

3. A wafer processing system according to claim 1 wherein said matched process model includes:

a process simulator; and a post-simulation calibratable transform module for transforming the simulator output signals and outputting calibrated simulation result signals closely matching corresponding result values stored in said sample-and-measure means for corresponding settings of process parameters.

4. A wafer processing system according to claim 1 wherein said matched process model includes:

an RSM/kriging module for more quickly emulating the behavior of the process simulator.

5. A wafer processing system according to claim 1 wherein said consultor means includes a prominent signal analyzer.

6. A wafer processing system comprising:

(a) a mass-production line for processing one or more lots of wafers, each wafer being processed to form a predefined circuit layout repeatedly thereon, the predefined circuit layout having at least one critically-dimensioned feature that defines operational characteristics of the corresponding circuit, wherein the mass-production line has a plurality of controllable process parameters with each said controllable process parameter having a respective mean setting and a respective variance as seen by in-process wafers of said one or more lots of wafers;

(b) sample-and-measure means for sampling in-process wafers flowing through a given part of the mass-production line and for measuring and recording dimensions of prespecified features of the sampled wafers;

(c) a machine-implemented, matched process model that is defined by use of the recorded dimensions to model the statistical behavior of the mass-production line at least with respect to the dimensions of prespecified features of the sampled wafers, (c.1) wherein the matched process model includes programmable, mean-and-variance modeling means for modeling respective mean settings and respective variances of a respective one or more of the controllable process parameters of said mass-production line; and (d) consultor means for temporarily modifying respective combinations of modeled mean setting and modeled variance of a respective one or more of the controllable process parameters so as to thereby cause the temporarily modified process model to predict the statistical behavior of the mass-production line, at least with respect to the dimensions of the prespecified features, for large numbers of wafers, given the modified combinations of respective mean settings and respective variances.

7. A wafer processing system according to claim 6 wherein:

said mass-production line includes:

(a.1) coating means for forming one or more material layers on in-process wafers, (a.2) radiation exposing means for receiving in-process wafers from the coating means and for exposing one or more of said material layers of the received in-process wafers to patterning radiation in accordance with said predefined circuit layout;

(a.3) developing means for receiving in-process wafers from the exposing means and for developing the exposed one or more material layers; and (a.4) post-development processing means for receiving in-process wafers from the developing means and for further processing the developed wafers;

(a.5) wherein one or more of said coating, exposing, developing and post-development processing means has controllable process parameters defining at least a first and second of said controllable process parameters of the mass-production line;

(a.6) wherein said first and second controllable process parameters each has a respective mean setting and a respective variance as seen by said in-process wafers of the one or more lots of wafers;

(c.1a) said mean-and-variance modeling means models at least the respective mean settings and respective variances of the first and second controllable process parameters; and (d.1) said consultor means includes means for temporarily modifying the respective combinations of modeled mean setting and modeled variance of the respective first and second controllable process parameters.

8. A wafer processing system according to claim 7 wherein said first and second controllable process parameters are selected from the group consisting of:

(a.1a) an anti-reflection coating (ARC) layer thickness provided by said coating means;

(a.1b) an ARC refractive index provided by said coating means;

(a.1c) a photoresist thickness provided by said coating means;

(a.2a) a focus depth of said radiation exposing means;

(a.2b) an exposure energy dosage provided by said radiation exposing means;

(a.2b') an exposure intensity provided by said radiation exposing means;

(a.2b") an exposure duration provided by said radiation exposing means;

(a.2c) a partial coherence of exposure radiation provided by said radiation exposing means;

(a.2d) a minimum patterning dimension provided by said radiation exposing means;

(a.2e) a coefficient of thermal expansion of the radiation exposing means;

(a.2f) a numeric aperture provided by said radiation exposing means;

(a.2g) a lens curvature provided by said radiation exposing means;

(a.2h) a phase shift angle provided by said radiation exposing means;

(a.3a) a development time provided by said developing means;

(a.3b) a development temperature provided by said developing means; and (a.3c) a diffusion length provided by said developing means.

9. A wafer processing system according to claim 8 wherein said post-development processing means includes a plasma etching means and the first and second controllable process parameters are additionally selectable from the group consisting of:

(a.4a) a chamber pressure provided by said etching means;

(a.4b) a flow rate provided by said etching means;

(a.4c) a temperature provided by said etching means;

(a.4d) a field intensity provided by said etching means; and (a.4e) an etch time provided by said etching means.

10. A wafer processing system according to claim 6 wherein:

(a.1) said at least one critically-dimensioned feature includes a transistor gate; and (b.1) said dimensions of prespecified features of the sampled wafers include widths of conductive lines that do not define transistor gates in the corresponding circuits.

11. A wafer processing system according to claim 10 wherein:

(b.2) conductive lines include lines located in in-scribe areas of the wafers.

12. A wafer processing system according to claim 6 wherein said mean-and-variance modeling means comprises:

(c.1a) first memory means for storing said modeled mean settings;

(c.1b) second memory means for storing said modeled variances;

(c.1c) one or more random number generators, responsive to the modeled variances stored in said second memory means, for outputting respective random number samples;

(c.1d) one or more summing units for receiving modeled mean settings from the first memory means, for receiving random number samples from the one or more random number generators, and for adding respective ones of the received mean settings and respective ones of the received random number samples to thereby generate simulated process parameter signals representing a simulated one or more of the controllable process parameters.

13. A wafer processing system according to claim 12 wherein said matched process model further includes:

(c.2) a first process simulator operatively coupled to receive said simulated process parameter signals and to model a response of said mass-production line to the controllable process parameters represented by the simulated process parameter signals.

14. A wafer processing system according to claim 13 wherein:

(c.2a) said first process simulator simulates a lithography process of the mass-production line.

15. A wafer processing system according to claim 13 wherein:

(c.2a) said first process simulator defines a slow-to-evaluate simulator;

(c.3) said matched process model further includes a faster-to-evaluate second simulator that is bootstrap-wise created by use of the slow-to-evaluate simulator, said faster-to-evaluate second simulator providing a substantially equivalent process simulation as does the slow-to-evaluate first simulator in less time for a given subset of the simulated process parameter signals; and (c.4) said matched process model further includes replacement means for replacing the slow-to-evaluate first simulator with the faster-to-evaluate second simulator when the simulated process parameter signals are within said given subset.

16. A wafer processing system according to claim 15 wherein the faster-to-evaluate second simulator includes a response surface modeler (RSM).

17. A wafer processing system according to claim 15 wherein the faster-to-evaluate second simulator includes a kriging error-correction interpolator.

18. A wafer processing system according to claim 15 wherein the faster-to-evaluate second simulator includes a response surface modeler (RSM) and an error-correction interpolator coupled to an output of the RSM for correcting errors between outputs of the RSM and outputs of the slow-to-evaluate first simulator.

19. A wafer processing system according to claim 6 further comprising:

(e) expert control means, operatively coupled to the sample-and-measure means, to the consultor means, and to the mass-production line, for detecting undesired variances in the statistical distribution of the processed wafer outflow of the mass-production line, for querying the consultor means to identify the most likely contributing causes for said undesired variances, and for responsively adjusting the settings of process parameters and/or the tolerance allowances of those process parameters that are identified as being the most likely contributing causes for said undesired variances.

20. A wafer processing system according to claim 6 further comprising:

(e) expert control means, operatively coupled to the sample-and-measure means and to the consultor means, (e.1) said expert control means being for automatically detecting an undesired change in statistical distribution of said measured dimensions of the prespecified features of the sampled wafers, and (e.2) said expert control means further being for querying the consultor means to identify the most likely contributing factors for the detected undesired change of statistical distribution, the contributing factors being selected from among said modeled respective mean settings and respective variances of the respective one or more of the controllable process parameters.

21. A wafer processing system according to claim 20 wherein said expert control means includes:

(e.3) first profile receiving means for receiving a first data set representing an acceptable statistical distribution profile for the at least one critically-dimensioned feature;

(e.4) second profile receiving means for receiving a second data set representing the observed statistical distribution profile of the measured dimensions of prespecified features;

(e.5) extrapolating means for extrapolating from the received second data set an estimation of what the corresponding statistical distribution profile is on the sampled wafers for the critically-dimensioned features of the sampled wafers; and (e.6) testing means for testing the extrapolated profile against the acceptable profile.

22. A wafer processing system according to claim 21 wherein:

(d.1) said consultor means has a first mode of operation wherein the consultor means temporarily modifies corresponding combinations of modeled mean setting and modeled variance of a respective one or more of the controllable process parameters so as to thereby cause the temporarily modified process model to predict the statistical behavior of the mass-production line with respect to the critically-dimensioned features; and (e.5a) said extrapolating means uses the first mode of operation of the consultor means for extrapolating from the received second data set the estimation of what the corresponding statistical distribution profile is on the sampled wafers for the critically-dimensioned features of the sampled wafers.

23. A wafer processing system according to claim 6 further comprising:

(e) automatic, matched-process-model creating means for supplying to a prototype of the process model, actually measured process parameters from the production line, for obtaining corresponding actually-observed results from the production line, and for modifying the prototype of the process model so that outputs of the modified prototype more closely match the actually-observed results.

24. A wafer processing system according to claim 23 wherein the process model includes:

(c.2) a process simulator that outputs simulator output signals; and (c.3) a post-simulation calibratable transform module for transforming the simulator output signals and correspondingly outputting calibrated simulation result signals;

and wherein said matched-process-model creating means includes:

(e.1) calibrating means for comparing the simulator output signals with the actually-observed results from the production line, and for modifying the transform module so that outputs of the modified prototype more closely match the actually-observed results.

25. A wafer processing system comprising:

(a) a mass-production line for processing a plurality of wafers to produce from each wafer a plurality of devices, each said wafer being processed by the line to form a predefined layout of features repeatedly on the wafer, the predefined layout having at least one critically-dimensioned feature that defines operational characteristics of each correspondingly produced device of the wafer, wherein the mass-production line has a plurality of controllable process parameters with each said controllable process parameter having a respective mean and a respective variance as seen by in-process devices of each of said wafers;

(b) sampling means for obtaining from in-process wafers flowing through the mass-production line, sample measurements of prespecified features of the in-process wafers;

(c) a machine-implemented, process model that models the statistical behavior of the mass-production line at least with respect to said prespecified features, said model having one or more modifiable inputs corresponding to a respective one or more of the controllable process parameters of the mass-production line; and (d) a machine-implemented consultor means for temporarily disturbing one or more of the modifiable inputs of said model so as to thereby cause the temporarily disturbed process model to predict the statistical behavior of the mass-production line, at least with respect to the measured features given the temporary disturbing of said modifiable inputs.

26. A wafer processing system according to claim 25 wherein:

(a.1) said devices are integrated circuits each formed in a respective one of plural in-die areas of the wafers;

(b.1) said prespecified features are formed within in-scribe areas of the wafers, the in-scribe areas being interposed between the in-die areas.

27. A wafer processing system according to claim 25 wherein:

(a.1) said at least one critically-dimensioned feature of the predefined layout is an electrically conductive first structure having at least one of a respective first width, first thickness;

(b.1) said sampled prespecified features are each a second electrically conductive structure that is formed simultaneously with the corresponding at least one critically-dimensioned feature of the predefined layout and that has at least one of a corresponding second width, second thickness, and second sidewall slope; and (b.2) said sample measurements include at least one of the second width, second thickness, and second sidewall slope of the sampled prespecified features.

28. A wafer processing system according to claim 25 wherein:

(a.1) said at least one critically-dimensioned feature is a developed photoresist structure.

29. A wafer processing system according to claim 25 wherein said machine-implemented process model comprises:

(c.1) first modifiable memory means for storing modeled mean settings representing statistical means of the respective one or more controllable process parameters of the mass-production line;

(c.2) second modifiable memory means for storing modeled variances representing statistical variances of the respective one or more controllable process parameters of the mass-production line;

(c.3) random number generating means, responsive to the modeled variances for outputting respective random number samples;

(c.4) summing means for summing respective ones of the modeled mean settings with corresponding ones of the random number samples to thereby generate simulated process parameter signals representing simulations of one or more of the controllable process parameters.

30. A wafer processing system according to claim 29 wherein said machine-implemented process model receives as its modifiable inputs in a first mode said generated simulated process parameter signals and wherein said model further comprises:

(c.5) a process simulator that outputs simulator output signals in response to the received modifiable inputs; and (c.6) a post-simulation calibratable transform module for transforming the simulator output signals and for correspondingly outputting calibrated simulation result signals in accordance with a transformation that is calibratable to correspond with observed inputs and observed corresponding outputs of the mass-production line.

31. A wafer processing system according to claim 25 wherein said consultor means includes:

(d.1) prominent signal analyzer means for temporarily resetting modeled ones of the modifiable inputs one at a time to a null value.

32. A wafer processing system according to claim 25 wherein said consultor means includes:

(d.1) best leveraging analyzer means for sequentially selecting and modifying respective ones of the modifiable inputs one at a time in accordance with which modifiable input provides best leverage at the time for moving a modeled behavior of the mass-production line towards a predefined.

33. A wafer processing system according to claim 32 wherein said modeled behavior to be moved is variance of the at least one critically-dimensioned feature as seen across the produced devices.

34. A machine-implemented simulation system comprising:

(a) a slow-to-evaluate first simulator;

(b) a fast-to-evaluate second simulator that can be programmed to generate second results substantially equal to first results of the first simulator in less time than does the slow-to-evaluate first simulator when the so-programmed second simulator is given input parameters within a predefined range;

(c) bootstrapping means, responsive to results of the first simulator, for programming the fast-to-evaluate second simulator to generate said second results in response to input parameters within said predefined range; and (d) substituting means for substituting the programmed second simulator in place of the slow-to-evaluate first simulator.

35. A simulation system according to claim 34 wherein said bootstrapping means includes:

(c.1) drive means supplying a series of input parameter sets distributed through said predefined range to the slow-to-evaluate first simulator to thereby cause the first simulator to produce said first results; and (c.2) result storage means for storing the produced first results of the slow-to-evaluate first simulator.

36. A simulation system according to claim 35 wherein said drive means includes a Latin-hypercube driving engine.

37. A simulation system according to claim 34 wherein said fast-to-evaluate second simulator includes a response surface modeler (RSM).

38. A simulation system according to claim 34 wherein said fast-to-evaluate second simulator includes an error-correction interpolator.

39. A simulation system according to claim 34 wherein said slow-to-evaluate first simulator simulates a photolithographic process.

* * * * *

UNITED STATES PATENT AND TRADEMARK OFFICE
CERTIFICATE OF CORRECTION

PATENT NO.   : 5,655,110
DATED        : August 5, 1997
INVENTOR(S)  : Zoran Krivokapic et al.

It is certified that error appears in the above-indentified patent and that said Letters Patent is hereby corrected as shown below:

Column 2, line 49, "amass-production" should be --a mass-production--.
Column 5, line 60, "amass-production" should be --a mass-production--.
Column 12, line 15, after "switches", "289" should be --287--.
Column 17, line 15, "3 g" should be --3σ--.
Column 28, line 39, after "thickness" and before the semicolon (;) insert --, and first sidewall slope--.
Column 29, line 33, after "predefined" and before the period (.) insert --goal--.

Signed and Sealed this

Twenty-first Day of October 1997

Attest:

BRUCE LEHMAN

Attesting Officer

Commissioner of Patents and Trademarks